US011421080B2

(12) United States Patent
Dustin et al.

(10) Patent No.: US 11,421,080 B2
(45) Date of Patent: Aug. 23, 2022

(54) FLUOROPOLYMER ADHESIVES AND METHODS THEREOF

(71) Applicant: THE BOEING COMPANY, Chicago, IL (US)

(72) Inventors: Ashley M. Dustin, Los Angeles, CA (US); Andrew P. Nowak, Los Angeles, CA (US)

(73) Assignee: THE BOEING COMPANY, Chicago, IL (US)

( * ) Notice: Subject to any disclaimer, the term of this patent is extended or adjusted under 35 U.S.C. 154(b) by 611 days.

(21) Appl. No.: 16/226,953

(22) Filed: Dec. 20, 2018

(65) Prior Publication Data

US 2020/0199299 A1 Jun. 25, 2020

(51) Int. Cl.

| | |
|---|---|
| *C08L 79/04* | (2006.01) |
| *C08G 73/10* | (2006.01) |
| *C09D 7/61* | (2018.01) |
| *C08G 14/06* | (2006.01) |
| *C08G 14/12* | (2006.01) |
| *C08K 3/22* | (2006.01) |
| *C09D 5/18* | (2006.01) |
| *C09D 161/34* | (2006.01) |
| *C09D 179/08* | (2006.01) |
| *C09J 9/00* | (2006.01) |
| *C09J 11/04* | (2006.01) |
| *C09J 161/34* | (2006.01) |
| *C09J 179/08* | (2006.01) |
| *G03F 7/004* | (2006.01) |

(52) U.S. Cl.
CPC ......... *C08G 73/1067* (2013.01); *C08G 14/06* (2013.01); *C08G 14/12* (2013.01); *C08G 73/1017* (2013.01); *C08G 73/1082* (2013.01); *C08K 3/22* (2013.01); *C09D 5/18* (2013.01); *C09D 7/61* (2018.01); *C09D 161/34* (2013.01); *C09D 179/08* (2013.01); *C09J 9/00* (2013.01); *C09J 11/04* (2013.01); *C09J 161/34* (2013.01); *C09J 179/08* (2013.01); *G03F 7/0046* (2013.01); *C08K 2003/2268* (2013.01); *C08K 2003/2272* (2013.01); *C08K 2003/2275* (2013.01); *C08K 2201/005* (2013.01); *C08K 2201/011* (2013.01)

(58) Field of Classification Search
CPC ............... C08G 73/10; C08G 73/0233; C08K 2201/011; C08K 3/013; C09D 179/08; C09D 179/02; C09J 179/08; C08L 79/02
See application file for complete search history.

(56) References Cited

U.S. PATENT DOCUMENTS

| | | | |
|---|---|---|---|
| 5,004,801 | A | 4/1991 | Keller et al. |
| 5,202,414 | A | 4/1993 | Keller et al. |
| 5,350,828 | A | 9/1994 | Keller et al. |
| 8,530,607 | B2 | 9/2013 | Laskowski et al. |
| 8,921,510 | B1 | 12/2014 | Keller et al. |
| 2010/0204385 | A1* | 8/2010 | Kreiling ............ C08G 18/6677 524/500 |
| 2011/0263775 | A1 | 10/2011 | Laskowski et al. |
| 2014/0378642 | A1 | 12/2014 | Keller et al. |

OTHER PUBLICATIONS

Allen et al "Physical and Mechanical Properties of Flexible Polybenzoxazine Resins: Effect of Aliphatic Diamine Chain Length", Journal of Applied Polymer Science, vol. 101, 2798-2809 (2006) published on Apr. 2006.*
Demir et al "Thermally curable fluorinated main chain benzoxazine polyethers via Ullmann coupling", Polym. Chem., 2013, 4, 2106, published on Jan. 2013.*
Extended European Search Report for Application No. 19212306. 5-1102 dated Aug. 25, 2020.
Keller, T. M.; Dominguez, D. D.; Laskoski, M., Oligomeric bisphenol A-based PEEK-like phthalonitrile-cure and polymer properties. Journal of Polymer Science Part A: Polymer Chemistry 2016, 54 (23), 3769-3777.
Laskoski, M.; Neal, A.; Keller, T. M.; Dominguez, D.; Klug, C. A.; Saab, A. P., Improved synthesis of oligomeric phthalonitriles and studies designed for low temperature cure. Journal of Polymer Science Part A: Polymer Chemistry 2014, 52 (12), 1662-1668.
Laskoski, M.; Schear, M. B.; Neal, A.; Dominguez, D. D.; Ricks-Laskoski, H. L.; Hervey, J.; Keller, T. M., Improved synthesis and properties of aryl ether-based oligomeric phthalonitrile resins and polymers. Polymer 2015, 67 (Supplement C), 185-191.
Parry, D. Navy Develops High Impact, High Integrity Polymer for Air, Sea, and Domestic Applications. <https://www.nrl.navy.mil/media/news-releases/2013/navy-develops-high-impact-high-integritypolymerforair-> sea-and-domestic-applications.
Partial European Search Report for Application No. 19212306.5-1102 dated May 25, 2020.
Kobzar Yaroslavl et al: "Fluorinated polybenzoxazines as advanced phenolic resins for leading-edge applications", Reactive and Functional Polymers, Elsevier, Amsterdam, NL vol. 133, Oct. 12, 2018.
Pedro Velez-Herrera et al: "Synthesis Characterization of Highly Fluorinated Polymer with the Benzoxazine Moiety in Main Chain", Macromolecules, vol. 41, No. 24, Dec. 23, 2008 (Dec. 23, 2008), pp. 9704-9714.

* cited by examiner

*Primary Examiner* — Gregory Listvoyb
(74) *Attorney, Agent, or Firm* — Patterson + Sheridan, LLP

(57) ABSTRACT

Examples of the present disclosure provide fluoropolymers and methods for forming and using such fluoropolymers. Fluoropolymers include polyfluorobenzoxazines and polyfluoroimides. Methods for forming polyphthalonitriles are also provided. The present disclosure is further directed to compositions containing one or more fluoropolymers and one or more metal oxides.

39 Claims, 5 Drawing Sheets

FLUOROPOLYMER ADHESIVES AND METHODS THEREOF

FIELD

The present disclosure provides fluoropolymers and methods for forming and using such fluoropolymers.

BACKGROUND

A vehicle, such as an aircraft, contains many components adhered to one another by adhesives and/or fasteners. Adhesives and fasteners should withstand chemical, thermal, and physical conditions experienced by the vehicle. In particular, thermosets chemically or physically join vehicle/aircraft components.

High temperature adhesives and elastomers are provided in a green state, or prepolymer form, with a specified application method and curing procedure. These procedures often involve specialized equipment and strict protocols to apply and cure the resins safely and effectively. The variety of high temperature adhesives and elastomers is limited by the chemical diversity of precursor elements with sufficiently high temperature resistant bonds as well as processing and manufacturing hurdles. Three issues that arise when manufacturing and processing high temperature polymers include:
1. Inherent temperature limitations.
    a. The glass transition temperature (Tg) often exceeds the degradation temperature which prevents thermoplastically shaping or molding the material (note the processing window is between the Tg and Tm).
    b. Curing of the polymer proceeds at high temperatures, requiring either the polymer to be pre-cured and then adhered, or the entire part to undergo the heating cycle.
2. Heat of reaction.
    a. Exothermic curing reactions performed with overly aggressive curing cycles can promote excessive and rapid oxidation.
3. Use of undesirable solvents and byproducts upon curing.
    a. High temperature resistant polymers are impervious to many chemicals often requiring chlorinated or fluorinated solvents for dissolution.
    b. Fluorine-containing monomers aid in achieving high temperature performance, however, the use of these monomers promote byproducts such as HF.

Regarding thermoset materials, thermosets have components that are typically fabricated with a peel ply on the surfaces to be joined, which is removed prior to joining, coupled with a surface preparation process such as grit blasting, plasma etching, and or hand sanding of the surfaces to be joined, and followed by bonding of those surfaces with an adhesive. Adhesives are typically thermosets or thermoplastics, such as poly ether ketone ketone (PEKK) or poly ether ether ketone (PEEK). However, thermoplastics are inherently more difficult for adhesive bonding applications in comparison to thermosets due to the chemical nature of poly aryl ether ketone matrix, and their associated processing temperatures and in-service temperature limitations when used in structural applications.

Phenolic thermosetting resin products provide some advantages, such as low flammability, low smoke generation, and good thermal and electrical properties. However, phenolic thermosetting resin products involve the use of strong reagents (acids for novolac and bases for resole resins), and they release water during the curing process, generating voids in the deposited layer. Furthermore, brittleness and a limited shelf life restrict the applicability of phenolic-based materials.

Thermosetting polybenzoxazines have the potential to compete with phenolic resins. The advantages of polybenzoxazines are their mechanical strength, good thermal properties, low water absorption, high glass transition temperatures, and high char yields. Additionally, they polymerize without the need for initiators, do not release byproducts, and display near-zero shrinkage. However, conventional polybenzoxazines do not possess enough temperature stability for use as adhesives under very high temperature conditions (>550° F.), which is increasingly necessary for adhesives used in aerospace applications.

There is a continuing need for improved adhesives with improved stability at high temperatures, as compared to conventional adhesives.

SUMMARY

In an example, a compound represented by Formula (I):

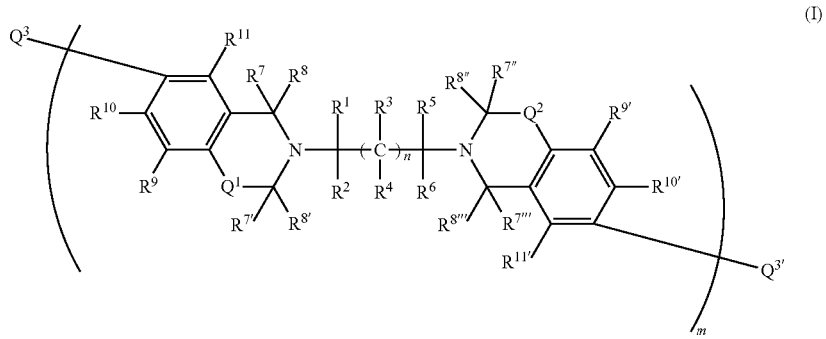

wherein:
each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;
each instance of $R^3$ and $R^4$ is independently hydrogen, unsubstituted $C_1$-$C_{10}$ alkyl, substituted $C_1$-$C_{10}$ alkyl, or fluorine, wherein at least one instance of $R^3$ or $R^4$ is fluorine;
each instance of $R^7$, $R^8$, $R^{7'}$, $R^{8'}$, $R^{7''}$, $R^{8''}$, $R^{7'''}$, and $R^{8'''}$ is independently hydrogen, unsubstituted $C_1$-$C_{10}$ alkyl, or substituted $C_1$-$C_{10}$ alkyl;

each instance of $R^9$, $R^{10}$, $R^{11}$, $R^{9'}$, $R^{10'}$, and $R^{11'}$ is independently hydrogen, unsubstituted $C_1$-$C_{10}$ alkyl, or substituted $C_1$-$C_{10}$ alkyl;

$R^{16}$ is hydrogen or hydroxyl;

each instance of $Q^1$ and $Q^2$ is independently oxygen or sulfur;

$Q^3$ and $Q^{3'}$ are independently hydrogen, amino, imido, unsubstituted $C_1$-$C_{10}$ alkyl, or substituted $C_1$-$C_{10}$ alkyl;

each instance of n is an integer from 1 to 20; and m is an integer from 1 to 15.

In an example, a composition includes a compound represented by Formula (I) and a metal oxide.

In an example, a compound represented by Formula (II):

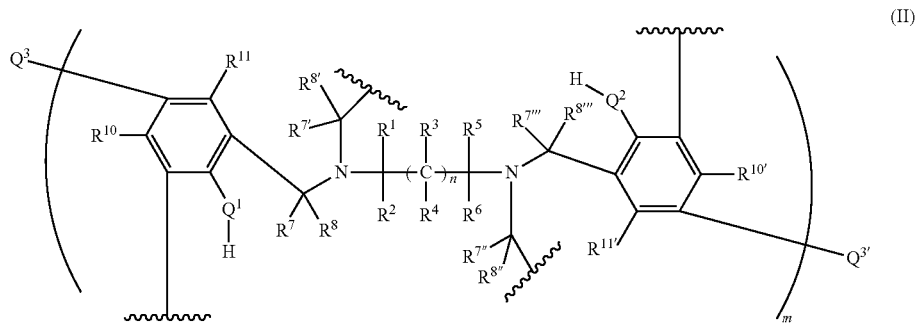

wherein:

each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;

each instance of $R^3$ and $R^4$ is independently hydrogen, unsubstituted $C_1$-$C_{10}$ alkyl, substituted $C_1$-$C_{10}$ alkyl, or fluorine, wherein at least one instance of $R^3$ or $R^4$ is fluorine;

each instance of $R^7$, $R^8$, $R^{7'}$, $R^{8'}$, $R^{7''}$, $R^{8''}$, $R^{7'''}$, and $R^{8'''}$ is independently hydrogen, unsubstituted $C_1$-$C_{10}$ alkyl, or substituted $C_1$-$C_{10}$ alkyl;

each instance of $R^{10}$, $R^{11}$, $R^{10'}$, and $R^{11'}$ is independently hydrogen, unsubstituted $C_1$-$C_{10}$ alkyl, or substituted $C_1$-$C_{10}$ alkyl;

each instance of $Q^1$ and $Q^2$ is independently oxygen or sulfur;

$Q^3$ and $Q^{3'}$ are independently hydrogen, amino, imido, unsubstituted $C_1$-$C_{10}$ alkyl, or substituted $C_1$-$C_{10}$ alkyl;

each instance of n is an integer from 1 to 20; and m is an integer from 1 to 15.

In an example, a composition includes a compound represented by Formula (II) and a metal oxide.

A compound is represented by Formula (III):

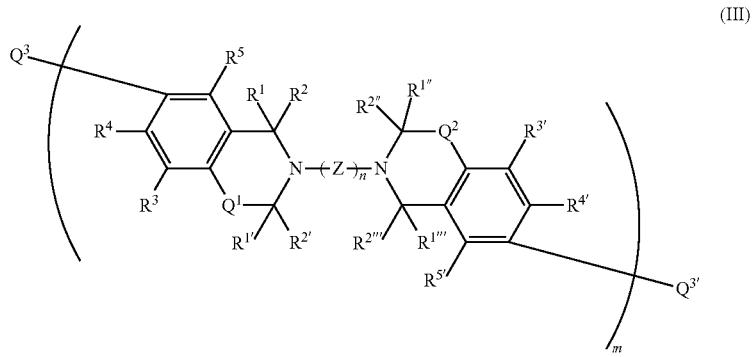

wherein:
Z is fluorinated aryl group;
each instance of $R^1$, $R^2$, $R^{1'}$, $R^{2'}$, $R^{1''}$, $R^{2''}$, $R^{1'''}$, and $R^{2''''}$ is independently hydrogen, unsubstituted $C_1$-$C_{10}$ alkyl, or substituted $C_1$-$C_{10}$ alkyl;
each instance of $R^3$, $R^4$, $R^5$, $R^{3'}$, $R^{4'}$, and $R^{5'}$ is independently hydrogen, unsubstituted $C_1$-$C_{10}$ alkyl, or substituted $C_1$-$C_{10}$ alkyl;
$R^{10}$ is hydrogen or hydroxyl;
each instance of $Q^1$ and $Q^2$ is independently oxygen or sulfur;
$Q^3$ and $Q^{3'}$ are independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

In an example, a composition includes a compound represented by Formula (III) and a metal oxide.

In an example, a compound is represented by Formula (IV):

wherein:
Z is fluorinated aryl group;
each instance of $R^1$, $R^2$, $R^{1'}$, $R^{2'}$, $R^{1''}$, $R^{2''}$, $R^{1'''}$, and $R^{2''''}$ is independently hydrogen, unsubstituted $C_1$-$C_{10}$ alkyl, or substituted $C_1$-$C_{10}$ alkyl;
each instance of $R^4$, $R^5$, $R^6$, $R^{4'}$, $R^{5'}$, and $R^{6'}$ is independently hydrogen, unsubstituted $C_1$-$C_{10}$ alkyl, or substituted $C_1$-$C_{10}$ alkyl;
each instance of $Q^1$ and $Q^2$ is independently oxygen or sulfur;
$Q^3$ and $Q^{3'}$ are independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

In an example, a composition includes a compound represented by Formula (IV) and a metal oxide.

In an example, a compound is represented by Formula (V):

wherein:
each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;
each instance of $R^3$ and $R^4$ is independently hydrogen, amino, unsubstituted $C_1$-$C_{10}$ alkyl, substituted $C_1$-$C_{10}$ alkyl, or fluorine, wherein at least one instance of $R^3$ or $R^4$ is fluorine;
each instance of $R^7$ and $R^8$ is independently independently hydrogen, unsubstituted $C_1$-$C_{10}$ aryl, substituted $C_1$-$C_{10}$ aryl, unsubstituted $C_1$-$C_{10}$ alkyl, or substituted $C_1$-$C_{10}$ alkyl;
each instance of $Q^1$ and $Q^2$ is independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

In an example, a composition includes a compound represented by Formula (V) and a metal oxide.

In an example, a compound is represented by Formula (VI):

wherein:
Z is fluorinated aryl group;
each instance of $Q^1$ and $Q^2$ is independently hydrogen, amino, imido, unsubstituted $C_1$-$C_{10}$ alkyl, or substituted $C_1$-$C_{10}$ alkyl;
each instance of $R^1$ and $R^2$ is independently independently hydrogen, unsubstituted $C_1$-$C_{10}$ alkyl, or substituted $C_1$-$C_{10}$ alkyl;
each instance of n is an integer from 1 to 20; and
m is an integer from 1 to 15.

In an example, a composition includes a compound represented by Formula (VI) and a metal oxide.

In an example, a method for forming a polyfluorobenzoxazine includes introducing a fluorinated diamine to a bisphenol (e.g., a fluorinated bisphenol), a formaldehyde, and a solvent to form a mixture, wherein a molar ratio of diamine:bisphenol is from about 1:1 to about 2:1. The method includes refluxing the mixture, and obtaining the polyfluorobenzoxazine.

In an example, a method includes forming a crosslinked polyfluorobenzoxazine by:
applying a composition to a surface of a component, the composition comprising:
a polyfluorobenzoxazine, and
a solvent;
curing the composition at a first temperature of about 100° C. or greater;
increasing the first temperature to a second temperature of about 160° C. or greater; and
obtaining a coating disposed on the surface of the component, the coating comprising the crosslinked polyfluorobenzoxazine.

In an example, a method includes forming a polyphthalonitrile by:
introducing a solvent having a boiling point of 140° C. or greater, a solvent having a boiling point less than 140° C., a catalyst, and one or both of a polyfluorobenzoxazine and a fluorodiamine to form a mixture;
refluxing the mixture;
removing the low boiling point solvent to form a second mixture;
introducing a phthalonitrile to the second mixture to form a third mixture, wherein a molar ratio of phthalonitrile to polyfluorobenzoxazine or fluorodiamine can be from about 1:1 to about 3:1; and
precipitating the polyphthalonitrile from the third mixture.

In an example, a method includes forming a crosslinked polyphthalonitrile by:
applying a composition to a surface of a component, the composition comprising:
a polyphthalonitrile, and
a solvent;
curing the composition at a first temperature of about 100° C. or greater;
increasing the first temperature to a second temperature of about 160° C. or greater; and
obtaining a coating disposed on the surface of the component, the coating comprising the crosslinked polyphthalonitrile.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this present disclosure and are therefore not to be considered limiting of its scope, for the present disclosure may admit to other equally effective examples.

To facilitate understanding, identical reference numerals have been used, where possible, to designate identical elements that are common to the figures. It is contemplated that elements and features of one example may be beneficially incorporated in other examples without further recitation.

DETAILED DESCRIPTION

Figure 1:
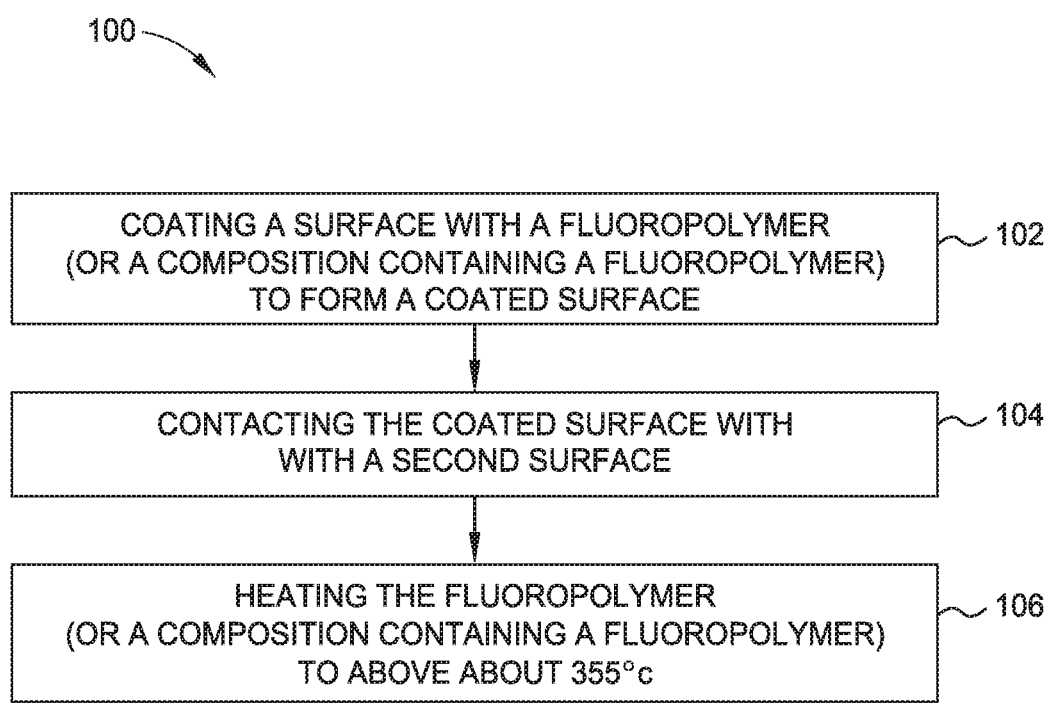
FIG. 1 is a flow diagram of a method for using a fluoropolymer (or composition containing a fluoropolymer) as an adhesive, according to one example.

The present disclosure provides fluoropolymers and methods for forming and using such fluoropolymers. Fluoropolymers of the present disclosure can provide adhesives suitable for use in high temperature environments. The present disclosure further provides compositions containing one or more fluoropolymers and one or more metal oxides nanoparticles. Metal oxide nanoparticles can provide improved radical scavenging ability, as compared to larger radical scavenging particles. The present disclosure further provides methods of making fluoropolymers and uses of fluoropolymers and compositions containing fluoropolymers.

Fluoropolymers

In at least one example, a fluoropolymer is a polyfluorobenzoxazine represented by Formula (I):

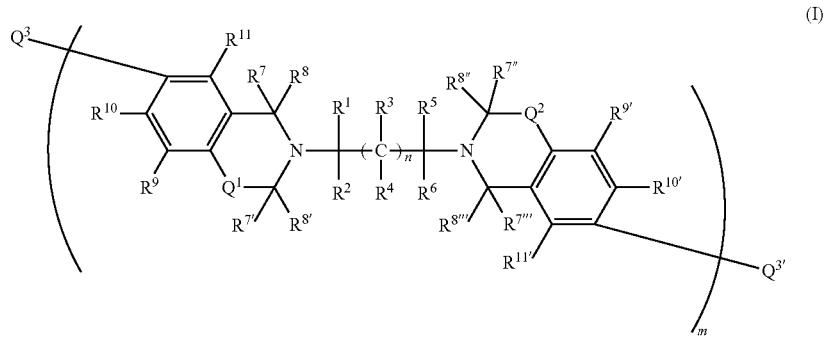

(I)

wherein:
each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;
each instance of $R^3$ and $R^4$ is independently hydrogen, unsubstituted $C_1$-$C_{10}$ alkyl, substituted $C_1$-$C_{10}$ alkyl, or fluorine, wherein at least one instance of $R^3$ or $R^4$ is fluorine;
each instance of $R^7$, $R^8$, $R^{7'}$, $R^{8'}$, $R^{7''}$, $R^{8''}$, $R^{7'''}$, and $R^{8'''}$ is independently hydrogen, unsubstituted $C_1$-$C_{10}$ alkyl, or substituted $C_1$-$C_{10}$ alkyl;
each instance of $R^9$, $R^{10}$, $R^{11}$, $R^{9'}$, $R^{10'}$, and $R^{11'}$ is independently hydrogen, unsubstituted $C_1$-$C_{10}$ alkyl, or substituted $C_1$-$C_{10}$ alkyl;
each instance of $Q^1$ and $Q^2$ is independently oxygen or sulfur;

$Q^3$ and $Q^{3'}$ are independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

Each instance of $R^1$, $R^2$, $R^5$, and $R^6$ of Formula (I) may be hydrogen. Each instance of $R^3$ may be fluorine. Each instance of $R^4$ may be fluorine. In at least one example, each instance of $Q^1$ and $Q^2$ is oxygen. Each instance of $R^7$, $R^8$, $R^{7'}$, $R^{8'}$, $R^{7''}$, $R^{8''}$, $R^{7'''}$, and $R^{8'''}$ may be hydrogen. Each instance of $R^9$, $R^{10}$, $R^{11}$, $R^{9'}$, $R^{10'}$, and $R^{11'}$ may be hydrogen. n can be an integer from 3 to 10. m can be from 2 to 10, such as from 3 to 6.

In at least one example, a fluoropolymer is a crosslinked polyfluorobenzoxazine represented by Formula (II):

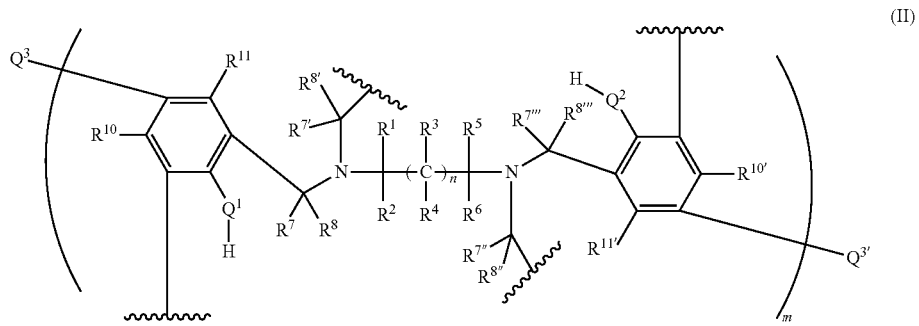

(II)

wherein:
each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;
each instance of $R^3$ and $R^4$ is independently hydrogen, unsubstituted $C_1$-$C_{10}$ alkyl, substituted $C_1$-$C_{10}$ alkyl, or fluorine, wherein at least one instance of $R^3$ or $R^4$ is fluorine;
each instance of $R^7$, $R^8$, $R^{7'}$, $R^{8'}$, $R^{7''}$, $R^{8''}$, $R^{7'''}$, and $R^{8'''}$ is independently hydrogen, unsubstituted $C_1$-$C_{10}$ alkyl, or substituted $C_1$-$C_{10}$ alkyl;
each instance of $R^{10}$, $R^{11}$, $R^{10'}$, and $R^{1'}$ is independently hydrogen, unsubstituted $C_1$-$C_{10}$ alkyl, or substituted $C_1$-$C_{10}$ alkyl;
each instance of $Q^1$ and $Q^2$ is independently oxygen or sulfur;
$Q^3$ and $Q^{3'}$ are independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

Each instance of $R^1$, $R^2$, $R^5$, and $R^6$ of Formula (II) may be hydrogen. Each instance of $R^3$ may be fluorine. Each instance of $R^4$ may be fluorine. In at least one example, each instance of $Q^1$ and $Q^2$ is oxygen. $Q^3$ can be hydrogen or amino. Each instance of $R^7$, $R^8$, $R^{7'}$, $R^{8'}$, $R^{7''}$, $R^{8''}$, $R^{7'''}$ and $R^{8'''}$ may be hydrogen. Each instance of $R^{10}$, $R^{11}$, $R^{10'}$, and $R^{11'}$ may be hydrogen. n can be an integer from 3 to 10. m can be from 3 to 6.

In at least one example, a fluoropolymer is a polyfluorobenzoxazine represented by Formula (III):

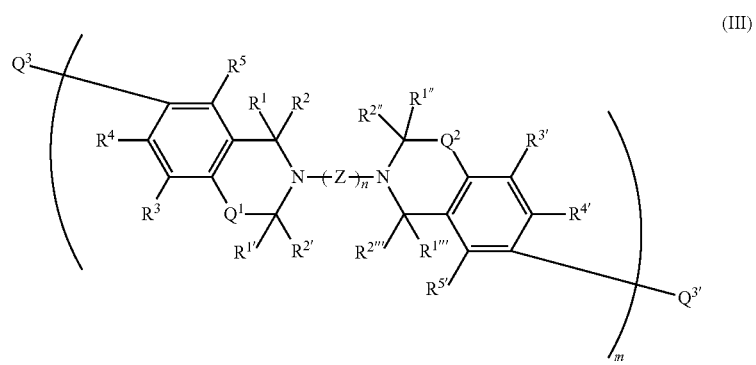

(III)

wherein:
Z is fluorinated aryl group;
each instance of $R^1$, $R^2$, $R^{1'}$, $R^{2'}$, $R^{1''}$, $R^{2''}$, $R^{1'''}$, and $R^{2'''}$ is independently hydrogen, unsubstituted $C_1$-$C_{10}$ alkyl, or substituted $C_1$-$C_{10}$ alkyl;
each instance of $R^3$, $R^4$, $R^5$, $R^{3'}$, $R^{4'}$, and $R^{5'}$ is independently hydrogen, unsubstituted $C_1$-$C_{10}$ alkyl, or substituted $C_1$-$C_{10}$ alkyl;
each instance of $Q^1$ and $Q^2$ is independently oxygen or sulfur; $Q^3$ and $Q^{3'}$ are independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

In at least one example, each instance of $Q^1$ and $Q^2$ is oxygen. $Q^3$ can be hydrogen or amino. Each instance of $R^1$, $R^2$, $R^{1'}$, $R^{2'}$, $R^{1''}$, $R^{2''}$, $R^{1'''}$, and $R^{2'''}$ may be hydrogen. Each instance of $R^3$, $R^4$, $R^5$, $R^{3'}$, $R^{4'}$, and $R^{5'}$ may be hydrogen. n can be an integer from 1 to 10. m can be from 1 to 10, such as from 3 to 6.

Z can be a phenyl group having 1, 2, 3, or 4 fluoro substituents or a naphthyl group having 1, 2, 3, 4, 5, or 6 fluoro substituents. In at least one example, Z is a fluorinated aryl group represented by the formula:

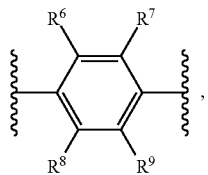

where each of $R^6$, $R^7$, $R^8$, and $R^9$ are independently selected from hydrogen, unsubstituted $C_1$-$C_{10}$ alkyl, substituted $C_1$-$C_{10}$ alkyl, or fluorine, wherein at least one instance of $R^6$, $R^7$, $R^8$, or $R^9$ is fluorine. In at least one example, each of $R^6$, $R^7$, $R^8$, or $R^9$ is fluorine.

In at least one example, a fluoropolymer is a crosslinked polyfluorobenzoxazine represented by Formula (IV):

wherein:
Z is fluorinated aryl group;
each instance of $R^1$, $R^2$, $R^{1'}$, $R^{2'}$, $R^{1''}$, $R^{2''}$, $R^{1'''}$, and $R^{2'''}$ is independently hydrogen, unsubstituted $C_1$-$C_{10}$ alkyl, or substituted $C_1$-$C_{10}$ alkyl;
each instance of $R^4$, $R^5$, $R^{4'}$, and $R^{5'}$ is independently hydrogen, unsubstituted $C_1$-$C_{10}$ alkyl, or substituted $C_1$-$C_{10}$ alkyl;
each instance of $Q^1$ and $Q^2$ is independently oxygen or sulfur;
$Q^3$ and $Q^{3'}$ are independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

In at least one example, each instance of $Q^1$ and $Q^2$ is oxygen. $Q^3$ and $Q^{3'}$ can be independently hydrogen or amino. Each instance of $R^1$, $R^2$, $R^{1'}$, $R^{2'}$, $R^{1''}$, $R^{2''}$, $R^{1'''}$, and $R^{2'''}$ may be hydrogen. Each instance of $R^4$, $R^5$, $R^{4'}$, and $R^{5'}$ may be hydrogen. n can be an integer from 1 to 10. m can be from 1 to 10, such as from 3 to 6.

Z can be a phenyl group having 1, 2, 3, or 4 fluoro substituents or a naphthyl group having 1, 2, 3, 4, 5, or 6 fluoro substituents. In at least one example, Z is a fluorinated aryl group represented by the formula:

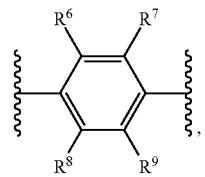

where each of $R^6$, $R^7$, $R^8$, and $R^9$ are independently selected from hydrogen, unsubstituted $C_1$-$C_{10}$ alkyl, substituted $C_1$-$C_{10}$ alkyl, or fluorine, wherein at least one instance of $R^6$, $R^7$, $R^8$, or $R^9$ is fluorine. In at least one example, each of $R^6$, $R^7$, $R^8$, or $R^9$ is fluorine.

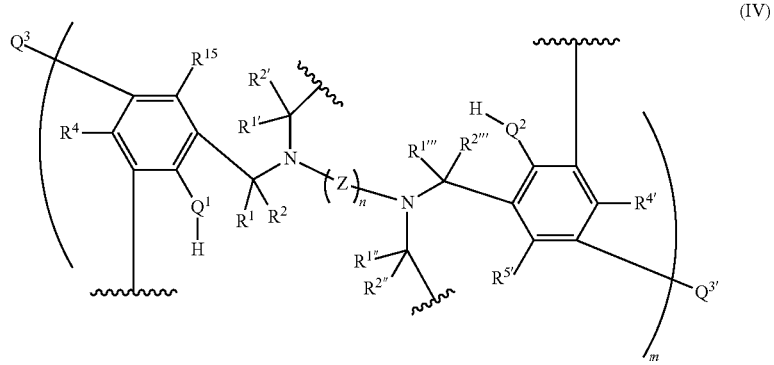

(IV)

In at least one example, a fluoropolymer is a polyfluoroimide represented by Formula (V):

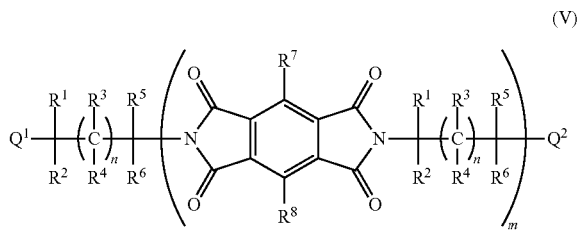

(V)

wherein:
each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;
each instance of $R^3$ and $R^4$ is independently hydrogen, amino, unsubstituted $C_1$-$C_{10}$ alkyl, substituted $C_1$-$C_{10}$ alkyl, or fluorine, wherein at least one instance of $R^3$ or $R^4$ is fluorine;
each instance of $R^7$ and $R^8$ is independently independently hydrogen, unsubstituted $C_1$-$C_{10}$ aryl, substituted $C_1$-$C_{10}$ aryl, unsubstituted $C_1$-$C_{10}$ alkyl, or substituted $C_1$-$C_{10}$ alkyl;
each instance of $Q^1$ and $Q^2$ is independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

Each instance of $R^1$, $R^2$, $R^5$, and $R^6$ of Formula (V) may be hydrogen. Each instance of $R^3$ may be fluorine. Each instance of $R^4$ may be fluorine. In some examples, at least one instance of $R^3$ and/or $R^4$ is (primary) amino. In at least one example, each instance of $Q^1$ and $Q^2$ is independently hydrogen or amino. Each instance of $R^7$ and $R^8$ may be independently unsubstituted $C_1$-$C_{10}$ aryl or unsubstituted $C_1$-$C_{10}$ alkyl. n can be an integer from 3 to 10. m can be from 3 to 6. When at least one of $R^3$ or $R^4$ is amino, the amine can react with anhydride starting material to form a crosslinked polyfluoroimide.

In at least one example, a fluoropolymer is a crosslinked polyfluoroimide represented by Formula (VI):

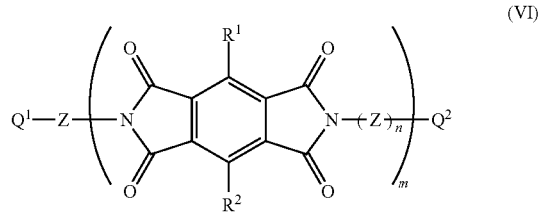

(VI)

wherein:
Z is fluorinated aryl group;
each instance of $Q^1$ and $Q^2$ is independently hydrogen, amino, imido, unsubstituted $C_1$-$C_{10}$ alkyl, or substituted $C_1$-$C_{10}$ alkyl;
each instance of $R^1$ and $R^2$ is independently independently hydrogen, unsubstituted $C_1$-$C_{10}$ alkyl, or substituted $C_1$-$C_{10}$ alkyl;
each instance of n is an integer from 1 to 20; and
m is an integer from 1 to 15.

In at least one example, each instance of $Q^1$ and $Q^2$ is independently hydrogen or amino. Each instance of $R^1$ and $R^2$ may be hydrogen. n can be an integer from 1 to 10. m can be from 2 to 10, such as from 3 to 6.

Z can be a phenyl group having 1, 2, 3, or 4 fluoro substituents or a naphthyl group having 1, 2, 3, 4, 5, or 6 fluoro substituents. In at least one example, Z is a fluorinated aryl group represented by the formula:

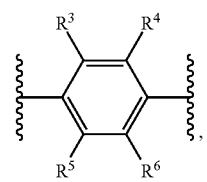

where each of $R^3$, $R^4$, $R^5$, and $R^5$ are independently selected from hydrogen, amino, unsubstituted $C_1$-$C_{10}$ alkyl, substituted $C_1$-$C_{10}$ alkyl, or fluorine, wherein at least one instance of $R^3$, $R^4$, $R^5$, and $R^5$ is fluorine. In at least one example, each of $R^3$, $R^4$, $R^5$, and $R^5$ is fluorine. When at least one of $R^3$, $R^4$, $R^5$, and $R^5$ is amino, the amine can react with anhydride starting material to form a crosslinked polyfluoroimide.

Fluoropolymer Syntheses

Fluoropolymers of the present disclosure can be obtained using fluorinated diamine starting materials and optional fluorinated amine end caps, which can be obtained as shown in Scheme 1.

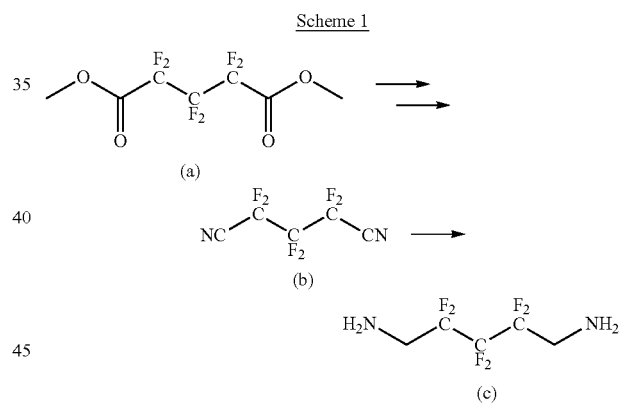

Scheme 1

Synthesis of fluorinated diamine (from Scheme 1c) following (or adapting) a procedure from Wood, J. L.; Khatri, N. A.; Weinreb, S. M., *Tetrahedron Letters* 1979, 20 (51), 4907-4910 for conversion of ester to cyano. A 2 mmol solution of the starting diester (Scheme 1a), obtained from Exfluor research corporation, in dry xylene can be treated with ~4 mmol of dimethylaluminum amide in dimethylchloride. The mixture can be heated at reflux for 30 min to overnight, and the progression of the reaction can be followed by thin layer chromatography (TLC). After the reaction is complete, it is cooled and water is added. The organic layer can be dried over magnesium sulfate and rotovaped to remove any residual solvent. The crude product can be purified using a silica gel column and/or precipitated and/or recrystallized. The dicyano product can then be reduced to a diamine using a common reducing agent such as lithium aluminum hydride or diisobutyl aluminum hydride and purified.

A fluorinated amine can be represented by Formula (VII):

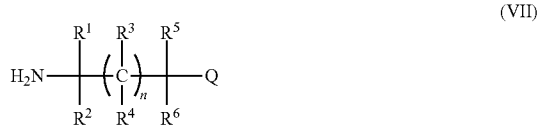

(VII)

wherein:
each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;
each instance of $R^3$ and $R^4$ is independently hydrogen, unsubstituted $C_1$-$C_{10}$ alkyl, substituted $C_1$-$C_{10}$ alkyl, or fluorine, wherein at least one instance of $R^3$ or $R^4$ is fluorine;
Q is hydrogen, amino, imido, unsubstituted $C_1$-$C_{10}$ alkyl, or substituted $C_1$-$C_{10}$ alkyl; and
n is an integer from 1 to 20.

Each instance of $R^1$, $R^2$, $R^5$, and $R^6$ of Formula (VII) may be hydrogen. Each instance of $R^3$ may be fluorine. Each instance of $R^4$ may be fluorine. n can be an integer from 3 to 10.

A fluorinated amine can be represented by Formula (VIII):

(VIII)

where Z is a fluorinated aryl group. Z can be a phenyl group having 1, 2, 3, or 4 fluoro substituents or a naphthyl group having 1, 2, 3, 4, 5, or 6 fluoro substituents. Q is hydrogen, amino, unsubstituted $C_1$-$C_{10}$ alkyl, or substituted $C_1$-$C_{10}$ alkyl.

In one example, a fluorinated amine is represented by the formula:

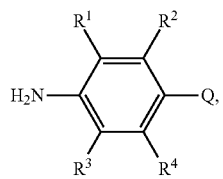

where each of $R^{11}$, $R^{12}$, $R^{13}$, and $R^{14}$ are independently selected from hydrogen, unsubstituted $C_1$-$C_{10}$ alkyl, substituted $C_1$-$C_{10}$ alkyl, or fluorine, wherein at least one instance of $R^{11}$, $R^{12}$, $R^{13}$, or $R^{14}$ is fluorine. In at least one example, each of $R^{11}$, $R^{12}$, $R^{13}$, or $R^{14}$ is fluorine. Q is hydrogen, amino, unsubstituted $C_1$-$C_{10}$ alkyl, or substituted $C_1$-$C_{10}$ alkyl.

Polyfluorobenzoxazines and Crosslinked Polyfluorobenzoxazines:

A fluorinated benzoxazine can be formed by mixing a fluorinated diamine, bisphenol, and paraformaldehyde in a suitable solvent. The value of m of the polyfluorobenzoxazine represented by Formula (I) or Formula (III) can be controlled by adjusting the molar ratio of diamine:bisphenol:formaldehyde. In at least one example, a molar ratio of diamine:bisphenol can be from about 1:1 to about 2:1. Suitable solvents include toluene, ethanol, hexafluoroxylene, or a mixture thereof. End caps can also be included in the mixture (or after the refluxing described below or before a second refluxing process) to provide viscosity control and modulus control of the polyfluorobenzoxazines formed. End caps can be monoamines or monoanhydrides (to form a $Q^3$ group of Formula (I) or Formula (III) that is imido).

Under an inert atmosphere (e.g. nitrogen or argon) with stirring, the reaction can proceed under reflux at elevated temperature for a period of time and then poured into an antisolvent (such as methanol, isopropanol, diethyl ether, or mixtures thereof) to precipitate the solid polymer (polyfluorobenzoxazine, e.g. a polyfluorobenzoxazine represented by Formula (I)). The precipitate can be filtered and dried under vacuum with heating (e.g. from about 40° C. to about 100° C., such as about 70° C.).

To crosslink the polyfluorobenzoxazine, a solution of polyfluorobenzoxazine can be dissolved in any suitable solvent, cast onto a substrate, dried (e.g. at an elevated temperature), and then cured in a stagewise manner at a temperature from about 100° C. to about 280° C. for about 1-5 hours/stage, as described in more detail below. For example, the solution can be cured at about 120° C. for about 1 hour, then about 160° C. for about 1 hour, then about 200° C. for about 1 hour, and then about 240° C. for about 1 hour. Suitable solvents include N-methyl-2-pyrrolidone (NMP, hexafluoroxylene, dimethylformamide, or a mixture thereof). The crosslinked polyfluorobenzoxazine can be a crosslinked polyfluorobenzoxazine represented by Formula (II).

Polyfluoroimides and Crosslinked Polyfluoroimides:

General synthesis of polyfluoroimides and crosslinked versions thereof following/adapting a procedure from Hsiao, S.-H.; Lin, K.-H., *High Performance Polymers* 2017, 29 (5), 544-555.: The polyimides can be synthesized by a two-step procedure: first by forming poly(amic acid) (PAA) precursors, followed by thermal or chemical imidization. A diamine (and/or triamine) monomer is added to a round-bottomed flask and dissolved in N,N-dimethylacetamide (DMAc). Then a dianhydride (and/or monoanhydride) is added to the multifunctional amine solution in one portion until reaching a solid content of approximately 10 wt %. Note—the amine monomer(s) may be fluorinated, and/or the anhydride monomer(s) may be fluorinated, and/or both the amine and anhydride monomer(s) may be fluorinated. Also, the ratio of mono:di:tri functional monomers will influence the reaction time/conditions and final imidization. Functionality >2 can result in a crosslinked final product. Functionality of 1 can act as an endcapping agent to modify/control molecular weight of the product. The mixture can be stirred at, for example, room temperature for about 3 h to yield a viscous fluorinated PAA solution. The fluorinated PAA solution may be stored for future imidization. Once the fluorinated PAA is ready for use it can be manipulated onto the substrate of interest and converted to a fluorinated polyimide by successive heating at elevated temperatures (150° C., 250° C., 300° C.) under vacuum. Alternatively, acetic anhydride and pyridine can be added to the fluorinated PAA solution, and the fluorinated PAA solution is manipulated onto the substrate of interest, and finally heated to a modest temperature (100° C.) to complete imidization. The product can be optionally purified via precipitation if the resulting (per)fluorinated polyimide is not crosslinked.

Polyphthalonitriles:

Polyphthalonitriles can be included in compositions of the present disclosure. Polyfluorobenzoxazines, fluorodiamines, and fluoromonoamines of the present disclosure can be used as a catalyst for the polyphthalonitrile formation to provide in situ formation of polyphthalonitriles during a curing stage of the present disclosure.

For example, one or more polyfluorobenzoxazine, fluorodiamine, or fluoromonoamine are mixed with a high boiling point solvent (boiling point of 140° C. or greater) and a low boiling point solvent (boiling point of less than 140° C.). High boiling point solvents may include dimethylformamide, or N-methyl-2-pyrrolidone. Low boiling point solvents may include hexafluoroxylene, or n-butyl acetate. Under an inert atmosphere (e.g. nitrogen or argon), a catalyst (such as a weak base, an acid, or a copper catalyst) is added to the mixture. Weak bases may include potassium carbonate, ammonia, methylamine, or ammonium hydroxide. Acids may include para-toluenesulfonic acid. Copper catalysts may include bromotris(triphenylphosphine)copper(I), or copper (II) acetylacetonate. A molar ratio of catalyst to polybenzoxazine (or fluorodiamine) can be from about 1 ppm to about 5000 ppm, such as from about 10 ppm to about 500 ppm.

The mixture including the catalyst is refluxed until water collection (e.g., in a Dean-Stark trap) is completed. The low boiling point solvent can be removed (e.g. distilled) and the reaction cooled to a temperature between room temperature and the boiling point of the high boiling point solvent. Once cooled, a phthalonitrile (such as 4-nitrophthalonitrile) can be added and the reaction can be heated to a temperature above room temperature (e.g., below 100° C.) for about 1 hour to about 48 hours, such as from about 12 hours to about 24 hours. A molar ratio of catalyst to phthalonitrile can be from about 1 ppm to about 5000 ppm, such as from about 10 ppm to about 500 ppm. A molar ratio of phthalonitrile(s) to polyfluorobenzoxazine or fluorodiamine can be from about 1:1 to about 3:1, such as about 2:1. The reaction can then be cooled (e.g. to room temperature) and the product precipitated using an aqueous acidic solution. The precipitate (including polyphthalonitrile) can be filtered, washed, and vacuum dried.

Exemplary polyphthalonitriles are shown in Hu, J.; Liu, Y.; Jiao, Y.; Ji, S.; Sun, R.; Yuan, P.; Zeng, K.; Pu, X.; Yang, G., RSC Advances 2015, 5 (21), 16199-16206. Examples include polyphthalocyanines, polyisoindolines, polytriazines, and combinations thereof.

To crosslink the polyphthalonitrile, a solution of polyphthalonitrile can be dissolved in any suitable solvent, cast onto a substrate, dried (e.g. at an elevated temperature), and then cured in a stagewise manner at a temperature from about 100° C. to about 280° C. for about 1-5 hours/stage, as described in more detail below.

Compositions

Compositions of the present disclosure can comprise one or more metal oxide nanoparticles. As used herein, a "composition", "mixture", or "formulation" may include the components of the compositions and/or the reaction product(s) of two or more components of the composition. Nanoparticles provide an increased overall surface area of metal oxide in the composition, as compared to a composition having larger particles, which provides not only improved radical scavenging due to the increased overall surface area but also a decreased weight of the composition because a smaller weight percent of metal oxide can be used for sufficient radical scavenging. A radical scavenging ability of the metal oxide (and overall composition) provides additional stability of the (adhesive) composition, as compared to the fluoropolymer by itself, at high temperatures because the metal oxide can interact with radicals that might otherwise interact with chemical bonds of the fluoropolymer.

The term "metal oxide" refers to a compound having a metal-oxygen bond, where oxygen has an oxidation number of −2. Exemplary metal oxides may include sodium oxide, magnesium oxide, calcium oxide, aluminum oxide, lithium oxide, silver oxide, iron (II) oxide, iron (III) oxide, chromium (VI) oxide, titanium (IV) oxide, copper (I) oxide, copper (II) oxide, zinc oxide, or zirconium oxide.

A metal oxide may include one or more of iron oxide (for example, FeO, $Fe_2O_3$ and $Fe_3O_4$), titanium oxide (for example, $TiO_2$), cerium oxide (for example, $CeO_2$), zinc oxide (for example, ZnO), or zirconium oxide (for example, $ZrO_2$). In one example, the at least one metal oxide comprises at least one of iron oxide (for example, FeO, $Fe_2O_3$ and $Fe_3O_4$) or titanium oxide (for example, $TiO_2$).

The at least one metal oxide can have a particle diameter size of from about 1 nanometer to about 5 micrometers, such as from about 25 nanometers to about 2 micrometers, such as from about 50 nanometers to about 500 nanometers.

One or more metal oxides may be present in a composition of the present disclosure where each metal oxide is independently from about 0.001 wt % to about 40 wt %, such as from about 0.01 wt % to about 25 wt %, such as from about 0.1 wt % to about 10 wt %, such as from about 1 wt % to about 5 wt % or from about 5 wt % to about 10 wt %, based on the total weight of the composition.

In addition, one or more fluoropolymers may be present in a composition of the present disclosure where each fluoropolymer is independently from about 10 wt % wt % to about 99.999 wt %, such as from about 25 wt % to about 99 wt %, such as from about 60 wt % to about 95 wt %, such as from about 85 wt % to about 90 wt %, based on the total weight of the composition.

A composition of the present disclosure can be formed by mixing the components of the composition in any suitable mixing device (such as a mixing device equipped with an overhead shear mixing blade). The mixing device can be heated (e.g. about 50° C. to about 100° C.) with stirring (e.g. about 200 rpm to about 500 rpm). The mixture may be stored in an airtight container at a low temperature (e.g. less than or equal to 0° F.) until further use.

A composition including one or more fluoropolymers of the present disclosure may have a glass transition temperature from about 135° C. to about 190° C., such as about 140° C. to about 180° C., such as about 145° C. to about 175° C., for example about 150° C., about 155° C., about 160° C., about 165° C., or about 170° C., as determined by ASTM D7426 for determination and ASTM E1356-08 for assigning. A composition including one or more fluoropolymers may have a melting temperature from about 200° C. to about 450° C., such as about 330° C. to about 355° C., such as about 335° C. to about 350° C., for example about 340° C. or about 345° C., as determined by ASTM D3418-15 and ASTM E794-06. A composition of the present disclosure can have a viscosity of from about 1,000 cP to about 1,000,000 cP at 150° C., such as from about 5,000 cP to about 50,000 cP, as determined by ASTM D3835-16 (using a capillary rheometer) and ASTM D7867-13 (rotational viscosity as a function of temperature).

As described above, compositions of the present disclosure can include a polyphthalonitrile (that may be optionally formed during curing (in situ) using a polyfluorobenzoxazine or fluorodiamine of the present disclosure as a catalyst, as described above). A composition may include a polyphthalonitrile in an amount of from about 0.1 wt % to about 40 wt %, such as from about 3 wt % to about 25 wt %, such as from about 10 wt % to about 15 wt %, based on the total weight of the composition.

In addition, a composition of the present disclosure can optionally further include one or more particulate fillers, a pigment, a dye, a plasticizer, a flame retardant, a flattening agent, oil, solvent, and a substrate adhesion promoter. Plasticizers may include diisodecyl phthalate, dioctyl phthalate, di-2-ethylhyexyl phthalate, and diisononyl phthalate. A particulate filler may be selected from silica, alumina, silicates, talc, aluminosilicates, barium sulfate, mica, diatomite, calcium carbonate, calcium sulfate, carbon, wollastonite, or combinations thereof. For example, a filler can be introduced to the composition before or while the fluoropolymer and metal oxide are being mixed.

A composition of the present disclosure may be impregnated into a fiber material to form a prepreg. The fiber material may be selected from graphite, fiberglass, nylon, aramid polymers, polyethylene, or mixture(s) thereof.

Fluoropolymer Applications

Fluoropolymers and compositions having a fluoropolymer can be disposed on a component to form a fluoropolymer coating disposed on the component. A component can be a part of a wind turbine, satellite, or a vehicle such as a car, a train, a boat, and the like. A vehicle component is a component of a vehicle, such as a structural component, such as an engine inlet lip, an airfoil, a wing, landing gear(s), a panel, or joint, of an aircraft. Examples of a vehicle component include an engine inlet lip, an airfoil (such as a rotor blade), an auxiliary power unit, a nose of an aircraft, a fuel tank, a tail cone, a panel, a coated lap joint between two or more panels, a wing-to-fuselage assembly, a structural aircraft composite, a fuselage body-joint, a wing rib-to-skin joint, and/or other internal component.

For example, fluoropolymers (and compositions containing fluoropolymers) of the present disclosure have superior physical and chemical properties as compared to existing thermoplastic polymer adhesives and prepreg polymers. In some examples, a fluoropolymer (or composition containing a fluoropolymer) undergoes processing at temperatures of about 355° C. to 385° C. without polymer degradation. Furthermore, in some examples, a fluoropolymer has glass transition temperatures below about 190° C. for joining thermoset applications without degrading the fluoropolymer (or composition overall). Furthermore, in some examples, a fluoropolymer (or composition containing a fluoropolymer) has environmental/chemical resistance equal to or better than base structures (e.g., vehicle components and, if present, other typical layers on the components).

Non-limiting examples for uses of fluoropolymers (and compositions containing fluoropolymers) of the present disclosure include uses as adhesives, for example thermoplastic adhesives, or as a component of prepreg material. For prepreg material, polymers of the present disclosure may be applied onto and/or impregnated into fiber materials composed of graphite, fiberglass, nylon, Kevlar® and related materials (for example, other aramid polymers), polyethylene, among others.

In some examples, a method includes using a fluoropolymer (or composition containing a fluoropolymer) as an adhesive. As shown in FIG. 1, a method 100 can include coating 102 a surface with at least one fluoropolymer (or composition containing a fluoropolymer) to form a coated surface. The method may include contacting 104 the coated surface with a second surface and heating 106 the fluoropolymer (or composition containing a fluoropolymer) to above about 355° C. The coated surface may include a thermoplastic prepreg, thermoset prepreg, and/or metal. Heating the composition to above about 355° C. may consolidate the thermoplastic prepreg (or cure the thermoset prepreg). The second surface may include a thermoplastic prepreg, thermoset prepreg, and/or metal, and heating the composition to above about 355° C. may consolidate the thermoplastic prepreg (or cure the thermoset prepreg) of the first surface and the thermoplastic prepreg (or thermoset prepreg) of the second surface. The method may further include coating the second surface with a fluoropolymer (or composition containing a fluoropolymer) to form a second coated surface. In some examples, the first surface and the second surface is each a surface of a vehicle component.

Diffusion Bonded Adhesive:

Fluoropolymers (and compositions containing fluoropolymers) may be used to join thermoplastics to thermoplastics and thermoplastics to thermosets. The fluoropolymer coating can be thermally stable at processing temperatures greater than 355° C. An adherend (to which the coating is applied) may be a thermoset composite, thermoplastic composite, or a metal substrate.

Figure 2:
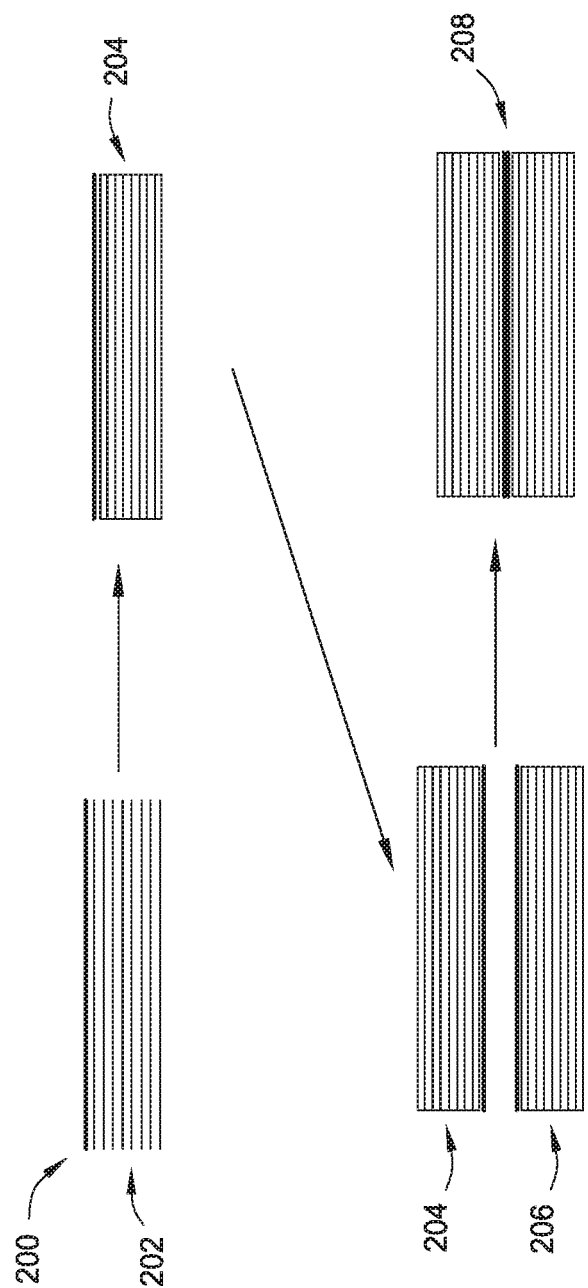
FIG. 2 is a schematic illustration of a fluoropolymer coating consolidation on an adherend, according to one example.

FIG. 2 is a schematic illustration of a fluoropolymer coating consolidation on an adherend. As shown in FIG. 2, stack 200 contains sheets 202 of thermoplastic prepreg. The sheets are not consolidated. Applying high heat (such as 355° C.-385° C.) and pressure promotes consolidation of the stack to form consolidated thermoplastic composite 204. Temperatures and pressures for consolidating known thermoplastic polymers degrade the polymers impregnated within and onto a prepreg. However, fluoropolymers of the present disclosure can provide temperature resistance at the typical processing temperatures.

Also shown in FIG. 2, consolidated thermoplastic prepreg 204 can be joined with a companion thermoplastic composite 206 using heat and pressure. The two or more thermoplastic prepregs may be already consolidated (e.g., consolidated thermoplastic prepreg 204) before joining of the two films. A fluoropolymer (or composition containing a fluoropolymer) is placed on a surface of consolidated thermoplastic prepreg 204 and/or a surface of companion thermoplastic composite 206. The surfaces are mated together by heating the structure with pressure, forming a bonded prepreg stack 208. A fluoropolymer (or composition containing a fluoropolymer) may promote adhesion without high viscosity upon heating and increased pressure. In general, polymer viscosity becomes unworkable if the polymer thermally degrades, further highlighting an advantage of a fluoropolymer (or composition containing a fluoropolymer) of the present disclosure. Also, a fluoropolymer (or composition containing a fluoropolymer) utilize physical interactions with an adjacent surface to promote adhesion of adjacent surfaces, as opposed to chemical reactions with adjacent surfaces which is typical for known polymers.

In some examples, one or both of the thermoplastic prepregs may be consolidated simultaneously upon a film joining (a "co-consolidation") (e.g, thermoplastic prepreg 204 and companion thermoplastic composite 206 are not yet consolidated upon film joining). Thus, the film joining process may also be a co-consolidation process.

Figure 3:
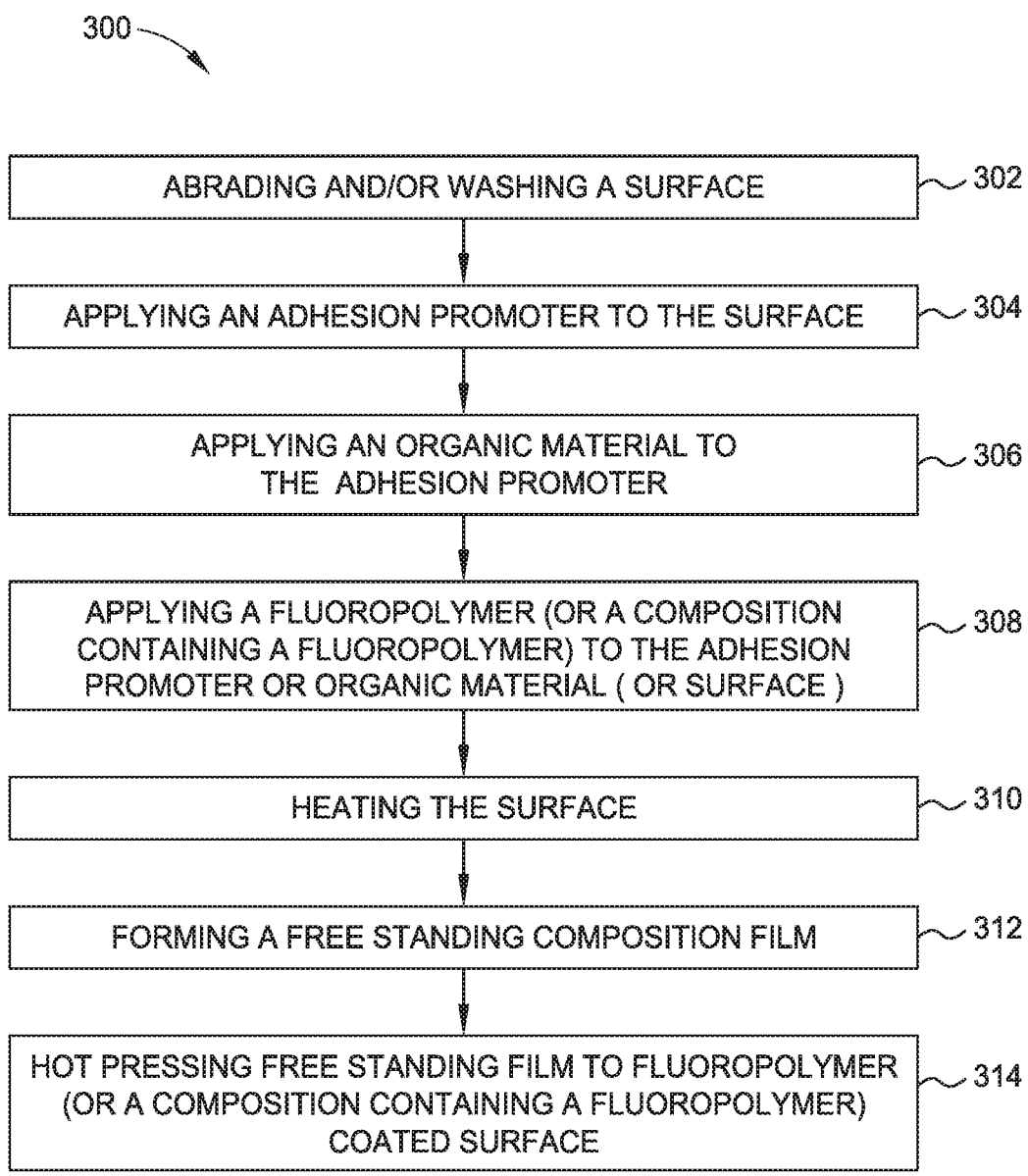
FIG. 3 is a flow diagram of a method for manufacturing surfaces having fluoropolymer coatings disposed thereon, according to one example.

Additional Fluoropolymer Applications:

FIG. 3 is a method 300 for manufacturing surfaces having fluoropolymer coatings disposed thereon. In at least one example, as shown in FIG. 3, a surface, such as a surface of a component, can be abraded and/or washed with a solvent (block 302). In at least one example, a surface is abraded with an abrasion pad to provide an exposed surface. For example, an aluminum surface is abraded to remove oxidized aluminum and expose an elemental aluminum surface. In at least one example, an abrasion pad has an about 100 grit surface to about 1,000 grit, such as about 400 grit to about 500 grit. Suitable abrasion pads include Scotch-Brite™ abrasion pads available from 3M Corporation. An abraded surface can be washed with soap and water with scrubbing to remove any loose surface material or debris. After washing, the surface (such as a surface of a vehicle component) can be introduced into an alkaline solution containing a detergent. Additionally or alternatively, an alkaline solution containing a detergent can be sprayed on the surface. The alkaline solution can be aqueous sodium hydroxide, sodium bicarbonate, potassium carbonate, or sodium carbonate. A detergent can be Micro-90® detergent (which includes surfactants and chelators) available from International Products Corporation of Burlington, N.J. The pH of the alkaline solution containing a detergent can be from about 7 to about 12, such as about 9. The surface (such as a surface of a vehicle component) present in the alkaline solution having a detergent can be sonicated for about 1 minute to about 1 hour, such as about 20 minutes. The alkaline solution having a detergent provides additional removal of oxidation on the surface. The surface (such as a surface of a vehicle component) can then be removed from the solution, washed with water, and introduced into an acetone bath. The surface present in the acetone bath can be sonicated for about 1 minute to about 1 hour, such as about 20 minutes. The surface is removed from the acetone bath and dried. The surface can be stored under an inert atmosphere, such as nitrogen or argon, until further use.

A coating of the present disclosure can be applied to the abraded surface directly (for example, in the manner described below) or the abraded surface can undergo further surface preparation, for example, as described below.

Surface Preparation for Spray Application

In at least one example, as shown in FIG. 3, a metal adhesion promoter is applied to the surface (block 304) to enhance the bond of an organic material to the surface. In at least one example, the method includes applying an adhesion promoter that is the reaction product of acetic acid, zirconium tetra-n-propoxide, and (3-glycidyloxypropyl) trimethoxysilane. An adhesion promoter can be Boegel®, such as 3M Surface Pre-Treatment AC-131 CB. 3% AC-131 kit can be obtained from 3M Corporation. The adhesion promoter can be a layer on the surface. 3% AC-131 is a non-chromate conversion coating and is typically disposed on aluminum, nickel, stainless steel, magnesium, and titanium alloys. AC-131 has a Part A, which is an aqueous mixture of glacial acetic acid (GAA) and zirconium tetra-n-propoxide (TPOZ) and a Part B, which is (3-glycidyloxypropyl)trimethoxysilane (GTMS). The two components are mixed together (Part A+ Part B) and the molar ratio of silicon to zirconium in the mixture is 2.77:1. A molar ratio of acetic acid to TPOZ in Part A is 0.45:1. The measured volumes of GAA and TPOZ can be mixed vigorously for about 10 minutes and then added to the Part A from the AC-131 kit. The premixed Part A solution can then be added to a measured volume of the Part B solution from the AC-131 kit and stirred followed by a 30 minute induction period. This solution is then disposed on the surface (such as a surface of a vehicle component) by spraying, immersing, brushing, and/or wiping. For example, suitable forms of spraying include spraying with a spray gun, high-volume, low-pressure spray gun, and/or hand pump sprayer. The solution is then cured (at room temperature or elevated temperature) to form a sol-gel. In at least one example, a curing temperature is from about 10° C. to about 150° C., such as from about 20° C. to about 100° C., such as from about 30° C. to about 70° C., such as from about 40° C. to about 50° C. Curing can be performed for a time period of from about 15 minutes to about 72 hours. An adhesion promoter layer can have a thickness of from about 0.5 mil to about 5 mil, such as from about 1 mil to about 2 mil.

In at least one example, as shown in FIG. 3, an organic material is deposited onto the adhesion promoter (block 306). The organic material can be a layer on the adjesion promoter. Organic material can include a primer such as an epoxy, a polyurethane, a primer material such as an epoxy or urethane primer, or a fiber-reinforced plastic. Depositing can include painting, spraying, immersing, contacting, adhering, and/or bonding sol-gel with the organic material to form an organic material layer. An organic material layer can have a thickness of from about 0.5 mil to about 5 mil, such as from about 1 mil to about 2 mil.

Depositing a Fluoropolymer Coating

In at least one example, as shown in FIG. 3, a fluoropolymer coating (which can be a fluoropolymer or composition containing a fluoropolymer) is applied (e.g. deposited or disposed onto) the adhesion promoter layer or the organic material layer or surface (e.g., metal surface) (block 308).

A fluoropolymer coating of the present disclosure can be formed by applying a composition to a surface of a component (e.g., the organic material layer disposed on a vehicle component). Compositions of the present disclosure can include a fluoropolymer and a metal oxide.

For example, a composition can be formed by mixing a fluoropolymer and a metal oxide and optionally heating the mixture (e.g., at a temperature of from about 80° C. to about 120° C., such as about 100° C.) with stirring.

A mixture of fluoropolymer (and optional metal oxide) may also include a solvent. The mixture can be stirred for from about 10 seconds to about 1 hour, such as from about 20 seconds to about 1 minute. The mixture is applied to a surface of a component (e.g., the organic material layer disposed on a vehicle component). The mixture can have a viscosity from about 0.00046 Pa*s to about 1 Pa*s at 25° C., such as from about 0.001 Pa*s to about 0.8 Pa*s at 25° C. as determined by ASTM D445-17a. A mixture can provide a viscosity sufficiently high, such as 0.00046 Pa*s or greater, to coat non-flat surfaces, such as non-flat metal surfaces, conformally (e.g., conformal deposition onto a curved surface of a vehicle component). The conformal coating can have a substantially uniform thickness across the surface. After a stage-wise curing of the present disclosure, the conformal coating can also have a low void content because of one or more of the low solvent content, high boiling point of the solvent, and stage-wise curing.

A solvent can be a hydrocarbon solvent, an ester solvent, or a fluorinated solvent. A solvent can have a boiling point of from about 50° C. to about 200° C., such as from about 100° C. to about 160° C. Ester solvents can include ethyl acetate, n-butyl acetate, or a mixture thereof. Hydrocarbon solvents can include toluene or xylenes. Fluorinated solvents can include 4-chlorobenzotrifluoride, 1,3-bis(trifluoromethyl)benzene, or a mixture thereof. Solvents of the present disclosure can provide dissolution of the components of the mixture in addition to having a boiling point that is sufficiently low to allow curing at low temperature, and conventional high boiling point solvents are merely optional. Solvents of the present disclosure can further provide dissolution of the components of the mixture in addition to having a boiling point that (in combination with the stage-wise curing described below) provides coatings having little or no voids.

In addition, a composition of the present disclosure can optionally further include one or more particulate fillers, a pigment, a dye, a plasticizer, a flame retardant, a flattening agent, and a substrate adhesion promoter. Plasticizers include diisodecyl phthalate, dioctyl phthalate, di-2-ethylhyexyl phthalate, and diisononyl phthalate. A particulate filler may be selected from silica, alumina, silicates, talc, aluminosilicates, barium sulfate, mica, diatomite, calcium carbonate, calcium sulfate, carbon, wollastonite, or combinations thereof. For example, a filler can be introduced to the composition before or while the fluoropolymer and metal oxide are being mixed.

A fluoropolymer (or fluoropolymer composition) can be applied to a surface of a component (e.g., the organic material layer) and cured. The mixture can be applied to a surface of a component by spray coating, dip coating, doctor-blade coating, spin coating, air knife coating, curtain coating, single and multilayer slide coating, gap coating, knife-over-roll coating, metering rod (Meyer bar) coating, reverse roll coating, rotary screen coating, extrusion coating, casting, or printing.

For example, a fluoropolymer (or fluoropolymer composition) can be poured onto the adhesion promoter layer or the organic material layer and drawn out across a surface of the adhesion promoter layer or the organic material layer with a doctor blade, draw down bar, direct or reverse gravure, offset gravure, Precision Slot Die, or Meyer rod to form a layer. The fluoropolymer (or fluoropolymer composition) can be drawn out at line speed of from 1 fpm to about 95 fpm at a coating web width of from about 4" wide to about 24" wide. The fluoropolymer (or fluoropolymer composition) can be drawn out in an inert atmosphere, e.g. nitrogen or argon. The layer can have a thickness of about 10 mils or greater. The drawn out fluoropolymer (or fluoropolymer composition) (as a layer) can be cured in a stage-wise process, as described in more detail below. In at least one example, the fluoropolymer (or fluoropolymer composition) is poured onto the adhesion promoter layer or the organic material layer through a gap, such as a slot die.

Alternatively, a fluoropolymer (or fluoropolymer composition) can be sprayed onto the adhesion promoter layer or the organic material layer using any suitable spray apparatus, such as an airbrush. In at least one example, during spraying, a nozzle of the spray apparatus is separated from the surface of the adhesion promoter layer or the organic material layer at a distance of from about 0.5 inch to about 30 inches, such as from about 2 inches to about 10 inches, such as from about 4 inches to about 8 inches, which is a distance sufficiently close to the surface to provide spraying at a controlled location of the surface. In at least one example, the fluoropolymer (or fluoropolymer composition) is sprayed onto the adhesion promoter layer or the organic material layer at a pressure of from about 7 psi to about 24 psi, such as from about 12 psi to about 18 psi. Other sprayer/pressure options can include: HVLP/LVLP from about 10 psi to about 60 psi; Air brushes from about 20 psi to about 50 psi; Hydraulic sprayers from about 500 psi to about 2000 psi; Robotic sprayers from about 100 to about 1000 psi.

The nozzle of the spray apparatus is moved parallel to the surface of the adhesion promoter layer or the organic material layer. Two full movements of the nozzle parallel to the surface ("there and back") of the adhesion promoter layer or the organic material layer is referred to as one "pass". One pass can deposit the fluoropolymer (or fluoropolymer composition) onto the surface at a thickness of from about 0.5 mil to about 2 mil, such as from about 0.8 mil to about 1.2 mil, such as about 1 mil. A time period from one pass to a subsequent pass can be from about 0.1 minute to about 30 minutes, such as from about 0.5 minute to about 5 minutes, such as from about 1 minute to about 2 minutes. Providing time in between passes promotes solvent removal from layers deposited by individual passes. Furthermore, stage-wise curing of the present disclosure, after one or more of the passes, can promote removal of solvent from the layer of the pass to further reduce void content of compositions of the present disclosure.

After several passes, a fluoropolymer (or fluoropolymer composition) (as a layer) is formed having a thickness of from about 10 mil to about 50 mil, such as from about 15 mil to about 45 mil, such as from about 20 mil to about 40 mil. Curing promotes removal of solvent from a composition (as a layer). Stage-wise curing further provides reduced "waxing out" of the fluoropolymer from the deposited layer.

For example, a fluoropolymer (or fluoropolymer composition) (layer) of the present disclosure can be cured at a temperature of about 50° C. or greater, such as from about 50° C. to about 150° C., such as from 50° C. to about 100° C., such as from about 50° C. to about 80° C. Curing the mixture can be performed for from about 5 minutes to about 2 hours (a "dwell time").

For example, a mixture (layer) of the present disclosure can be cured at a first temperature, such as a first temperature of about 50° C. or greater, such as from about 50° C. to about 150° C., such as from 50° C. to about 100° C., such as from about 50° C. to about 80° C. Curing the mixture at the first temperature can be performed for from about 5 minutes to about 2 hours (a "dwell time").

After a dwell time, the first temperature can be increased to a second temperature, such as a second temperature of about 80° C. or greater, such as from about 80° C. to about 150° C., such as from about 80° C. to about 130° C., such as from about 80° C. to about 100° C. Increasing the first temperature to the second temperature can be performed at a ramp rate of about 0.1° C./min to about 10° C./min, such as from about 0.5° C./min to about 5° C./min, such as from about 0.5° C./min to about 2° C./min. Curing the mixture at the second temperature can be performed for from about 5 minutes to about 10 hours, such as from about 5 minutes to about 2 hours (dwell time).

After a dwell time, the second temperature can be increased to a third temperature, such as a third temperature of about 100° C. or greater, such as from about 100° C. to about 200° C., such as from about 100° C. to about 150° C., such as from about 100° C. to about 120° C. Increasing the second temperature to the third temperature can be performed at a ramp rate of about 0.1° C./min to about 10° C./min, such as from about 0.5° C./min to about 5° C./min, such as from about 0.5° C./min to about 2° C./min. Curing the mixture at the third temperature can be performed for from about 5 minutes to about 10 hours, such as from about 5 minutes to about 2 hours (dwell time).

After a dwell time, the third temperature can be increased to a fourth temperature, such as a fourth temperature of about 120° C. or greater, such as from about 120° C. to about 250° C., such as from about 120° C. to about 200° C., such as from about 120° C. to about 150° C. Increasing the third temperature to the fourth temperature can be performed at a ramp rate of about 0.1° C./min to about 10° C./min, such as from about 0.5° C./min to about 5° C./min, such as from about 0.5° C./min to about 2° C./min. Curing the mixture at the fourth temperature can be performed for from about 5 minutes to about 10 hours, such as from about 5 minutes to about 2 hours (dwell time).

After a dwell time, the fourth temperature can be increased to a fifth temperature, such as a fifth temperature of about 150° C. or greater, such as from about 150° C. to about 250° C., such as from about 150° C. to about 220° C., such as from about 150° C. to about 200° C. Increasing the fourth temperature to the fifth temperature can be performed at a ramp rate of about 0.1° C./min to about 10° C./min, such as from about 0.5° C./min to about 5° C./min, such as from about 0.5° C./min to about 2° C./min. Curing the mixture at the fifth temperature can be performed for from about 5 minutes to about 10 hours, such as from about 5 minutes to about 2 hours (dwell time).

The temperature of the fluoropolymer (or fluoropolymer composition) during a curing stage can be determined by any suitable thermocouple contacting the surface, such as a Type K or Type J thermocouple. Heating a fluoropolymer (or fluoropolymer composition) can be performed using light exposure (e.g., ultraviolet light) of a surface. The light can be infrared (IR) or ultraviolet (UV). Exposing a mixture to light (and heating) can be performed using a FUSION UV curing unit fitted with a H+ bulb with a maximum emmittance at 365 nm. In at least one example, the bulb of the UV/IR curing unit is oriented about 450 relative to the flow direction of material flowing from the nozzle of the spray apparatus. In at least one example, the bulb of the UV/IR curing unit is separated from the surface at a distance of from about 8 inches to about 3 feet, such as about 11 inches to about 1.5 feet. An IR curing unit, for example, provides a smooth surface texture of the coating which might otherwise have a more rippled effect, providing improved durability of the surface against rain and sand erosion.

In at least one example, a coating (layer) of the present disclosure has an average void density of less than 5 voids of size 0.5 mm or greater per $cm^2$, such as less than 1 void of size 0.5 mm or greater per $cm^2$, as determined by optical microscopy, which can provide a smooth, conformal surface of the composition. In at least one example, a composition of the present disclosure has a surface roughness of less than about 100 microinches, such as less than about 90 microinches, such as less than about 80 microinches, such as less than about 70 microinches, such as from about 5 microinches to about 100 microinches, such as from about 20 microinches to about 80 microinches, as determined by ASTM D7127-05 (Standard Test Method for Measurement of Surface Roughness of Abrasive Blast Cleaned Metal Surfaces Using a Portable Stylus Instrument).

The smooth compositions (layers) of the present disclosure can provide stable laminar flow of water over the composition for reduced rain erosion as compared to conventional fluoropolymer layers. For example, a composition of the present disclosure can have a coating rain erosion rate of 0.5 mil/50 mins or less at 400 mph, such as 0.2 mil/50 mins or less, as determined by the University of Dayton method. A composition of the present disclosure can have a sand loading erosion of 50 $g/cm^2$ or greater at a 20 mil thickness at 500 mph at an impact angle of 20 degrees, such as 75 $g/cm^2$ or greater, such as 85 $g/cm^2$ or greater, as determined by the University of Dayton method.

Sand and Rain Erosion Testinq

Coated samples can be tested at the University of Dayton Research Institute on their Particle Erosion Test Rig (PETR) and Rain Rig.

Description of UDRI Rain rig: The "rain rig" is an 8-foot-diameter rotating arm and 96 calibrated needles are used to simulate flight in a 1 inch per hour rainfall. Coupon specimens are tested at speeds up to 650 mph, such as at 400 mph. Real-time video is monitored and recorded, allowing "time to failure" testing.

Sand erosion: "Dust rig": The "dust rig" was designed and developed in 1983 to simulate erosion effects on aircraft surfaces subjected and has been recently upgraded to test the larger mass loading seen by, for example, helicopter rotors. Typically, crushed silica (e.g., angular quartz) in sizes ranging from 240 microns to 550 microns (known as "golf sand") is used as the test media. Specimens are translated in front of an oscillating nozzle. The 6-inch square test area is uniformly covered with a pre-determined mass of particles of a known size at a measured speed up to 500 mph. Impact angles from normal to 20 degrees (70 degrees angle of incidence) can be tested, and many specimen configurations are possible. A calibrated screw feed in a plenum tank and an electronic pressure controller ensure correct mass delivery and stability, and a laser Doppler anemometry system is used to determine a delivery pressure for the required velocity.

The coatings (layers) of the present disclosure can provide improved mechanical properties as compared to conventional porous fluoropolymer coatings. For example, a coating of the present disclosure can have an elongation of from about 300% to about 1,000%, such as from about 400% to about 500%, as determined by ASTM D412. A coating of the present disclosure can have a tensile strength of from about 30 MPa to about 90 MPa, such as from about 70 MPa to about 90 MPa, as determined by ASTM D412.

Figure 4:
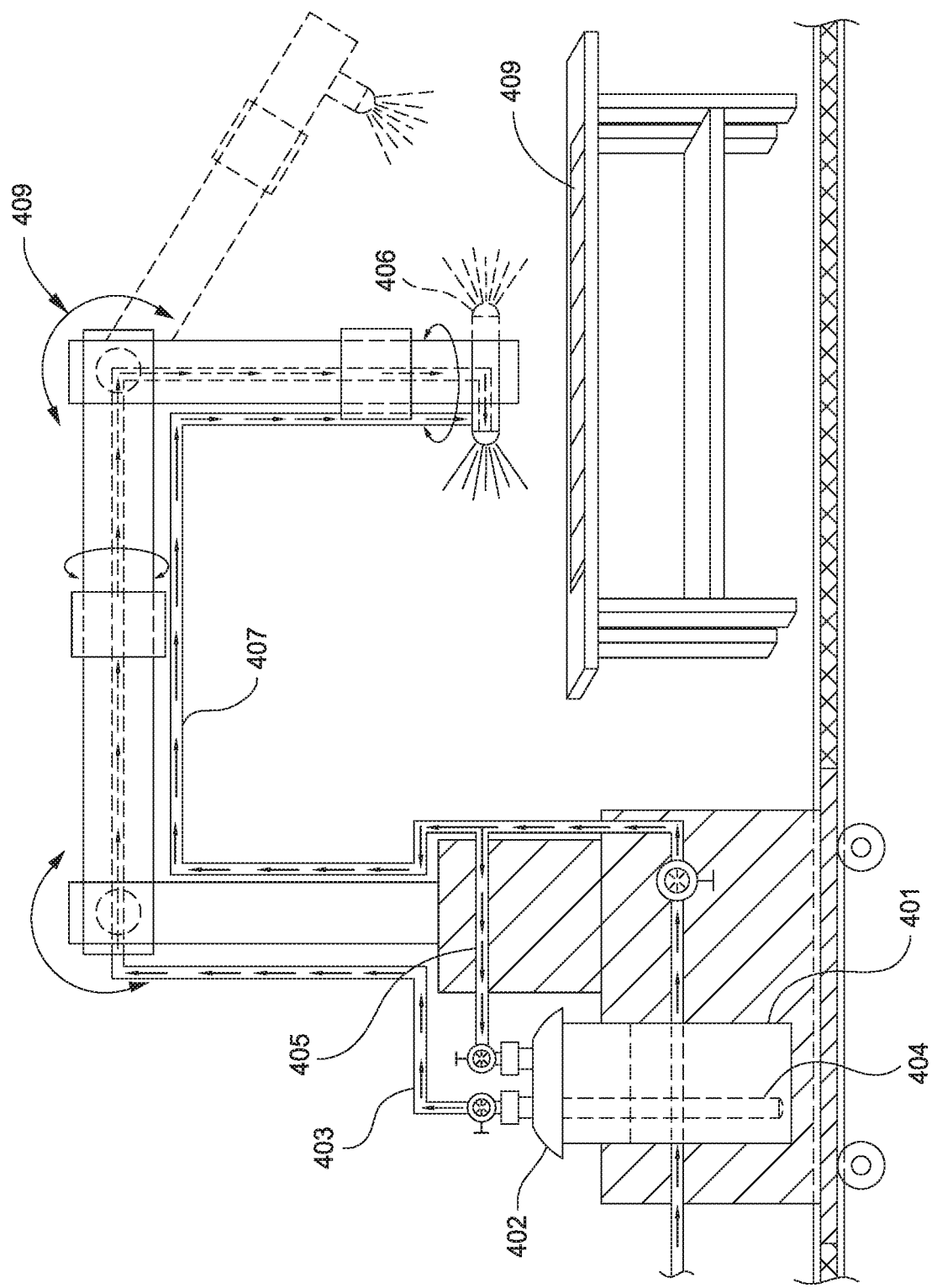
FIG. 4 is a robotic sprayer, according to one example.

In at least one example, the spray apparatus for depositing the fluoropolymer (or composition containing a fluoropolymer) is a robotic sprayer. FIG. 4 is a robotic sprayer. As shown in FIG. 4, a material (such as a fluoropolymer (or composition containing a fluoropolymer) is charged to a pressure pot 401 with a disposable polyethylene liner. The lid 402 is installed and clamped pressure tight. A fluid delivery hose 403 is connected to the pickup tube 404 inside the pressure pot. Pressure regulated nitrogen or dry air is injected through line 405 to pressurize the pot and force material into the pickup tube and line. The pressure pot has pressure relief valves to prevent over pressurization and to bleed pressure from the pot for removing or adding the material. A regulator is located near the gun 406 to control the fluid pressure being delivered. Controlling the fluid pressure at the gun controls the volumetric flow rate through the gun's spray nozzle. Installing the regulator near the gun eliminates any pressure drop influence from hose length, hose diameter, or robot arm height. Nozzle control is also desired to control flow rates. Slight manufacturing variances in the nozzle orifice can result in different liquid flow rates. Nozzle control and fluid pressure regulation at the gun work in conjunction to give consistent and repeatable volumetric flow rates through the nozzle. The air assist atomization pressure through line 407 also is regulated and controlled to give consistent spray dispersion from the nozzle.

The robot 408 carries the gun and is programmed to traverse across the surface of the component with a constant offset from the surface 409 (which can be a non-flat surface) and a controlled velocity. The spray from the nozzle typically has a flat fan pattern. Most of the spray material is deposited at the center of the fan with tapering amounts delivered at the fan edges. To compensate for this nonuniform distribution in the spray fan, the robot is programmed to overlap adjacent passes to even out the distribution. Typical pass indexing is ¼ fan width.

In at least one example, as shown in FIG. 3, method 300 includes heating the surface (such as a surface of a vehicle component) before, during, and/or after depositing fluoropolymer onto the surface (block 310). For example, heating the surface while depositing the fluoropolymer (or composition containing a fluoropolymer) onto the surface can provide in-situ solvent removal and increased viscosity of the fluoropolymer (or composition containing a fluoropolymer), providing conformal deposition onto a curved (non-flat) surface of a vehicle component. Heating the surface while depositing the composition onto the surface can provide additional uniform composition layers to achieve an overall thicker coating (e.g., 20 mil to 60 mil) with reduced or eliminated voids caused by trapped solvent because some or all of the solvent has been removed. Heating the surface while depositing fluoropolymer (or composition containing a fluoropolymer) onto the surface further provides smoother layers as compared to room temperature cured layers. The conformal coating has a substantially uniform thickness across the surface. During heating, a surface (such as a surface of a vehicle component) can have a temperature of from about 30° C. to about 70° C., such as from about 45° C. to about 55° C., as determined by any suitable thermocouple contacting the surface, such as a Type K or Type J thermocouple. Heating a surface can be performed using light exposure (e.g., ultraviolet light) of a surface. The light can be infrared (IR) or ultraviolet (UV). Exposing a surface to light (and heating) can be performed using a FUSION UV curing unit fitted with a H+ bulb with a maximum emmittance at 365 nm. In at least one example, the bulb of the UV/IR curing unit is oriented about 450 relative to the flow direction of material flowing from the nozzle of the spray apparatus. In at least one example, the bulb of the UV/IR curing unit is separated from the surface at a distance of from about 8 inches to about 3 feet, such as about 11 inches to about 1.5 feet. An IR curing unit, for example, provides a smooth surface texture of the coating which would otherwise have a more rippled effect, providing improved durability of the surface against rain and sand erosion.

Forming a Free Standing Film

In at least one example, as shown in FIG. 3, method 300 includes forming a free standing composition film (block 312). A fluoropolymer (or composition containing a fluoropolymer), as described above, is sprayed or deposited (as described above) onto the a mylar sheet, such as silanized mylar.

For example, a fluoropolymer (or composition containing a fluoropolymer) can be poured onto the mylar sheet and drawn out across a surface of the mylar sheet with a doctor blade, draw down bar, direct or reverse gravure, offset gravure, Precision Slot Die, or Meyer rod to form a layer. The fluoropolymer (or composition containing a fluoropolymer) can be drawn out at line speed of from 1 fpm to about 95 fpm at a coating web width of from about 4" wide to about 24" wide. The mixture can be drawn out in an inert atmosphere, e.g. nitrogen or argon. The layer can have a thickness of about 10 mils or greater. The drawn out mixture (layer) can be cured, as described above. In at least one example, the mixture is fluoropolymer (or composition containing a fluoropolymer) onto the mylar sheet through a gap, such as a slot die.

In at least one example, during spraying, a nozzle of the spray apparatus is separated from a surface of the mylar sheet at a distance of from about 0.5 inch to about 30 inches, such as from about 2 inches to about 10 inches, such as from about 4 inches to about 8 inches. In at least one example, the fluoropolymer (or composition containing a fluoropolymer) is sprayed onto the mylar sheet at a pressure of from about 7 psi to about 24 psi, such as from about 12 psi to about 18 psi. Other sprayer/pressure options can include: HVLP/LVLP from about 10 psi to about 60 psi; Air brushes from about 20 psi to about 50 psi; Hydraulic sprayers from about 500 psi to about 2000 psi; Robotic sprayers from about 100 to about 1000 psi. The nozzle of the spray apparatus is moved parallel to the surface of the mylar sheet. Two full movements of the nozzle parallel to the surface ("there and back") of the mylar sheet is referred to as one "pass". One pass can deposit the mixture onto the surface at a thickness of from about 0.5 mil to about 2 mil, such as from about 0.8 mil to about 1.2 mil, such as about 1 mil. A time period from one pass to a subsequent pass can be from about 0.1 minute to about 30 minutes, such as from about 0.5 minute to about 5 minutes, such as from about 1 minute to about 2 minutes. Providing time in between passes promotes solvent removal from layers deposited by individual passes. Furthermore, the deposited fluoropolymer (or composition containing a fluoropolymer) can be cured as described above. Curing after one or more of the passes can promote removal of solvent from the layer of the pass to further reduce void content of compositions of the present disclosure.

The free-standing film can be hot pressed at a temperature of from about 90° C. to about 150° C., such as about 100° C. In at least one example, two platens are heated to the desired temperature (e.g., 100° C.). The free-standing film is placed between two release layers (e.g., silanized mylar) and placed in between the hot platens. The hot platens are then closed providing pressure and heat on the film. The thermoplastic will flow and the thickness of the film can be controlled with the use of shims. The platens are then cooled down before pressure is removed. The temperature chosen for hot pressing is dependent on the thermoplastic or polymer film. In at least one example, the temperature of the platens is above the Tg (glass transition temperature) of the fluoropolymer but below the decomposition temperature.

Bonding of Free Standing Film to Composition Coated Surface

In at least one example, as shown in FIG. 3, method 300 includes bonding the free standing film to the coating of fluoropolymer (or composition containing a fluoropolymer) (block 314). An optional adhesive can be applied to one or both of an exposed (e.g., outer) coating surface of the free standing film or an exposed (e.g., outer) coating surface of the coated component. The adhesive can be pressed with pressure onto one or both of the fluoropolymer surface of the free standing film or the surface of the fluoropolymer coated component to reduce or eliminate air content between the adhesive and the applied surface. Adhesives include any suitable adhesive such as an epoxy, such as AF163-2K obtained from 3M Corporation. If the adhesive is applied to the fluoropolymer surface of the free standing film, a protective liner on the opposite surface of the adhesive is then removed and positioned over the composition surface of the coated component and then pressed with pressure onto the fluoropolymer surface of the fluoropolymer coated component. If the adhesive is applied to the composition surface of the fluoropolymer coated component, a protective liner on the opposite surface of the adhesive is then removed and positioned over the fluoropolymer surface of the free standing film and then pressed with pressure onto the fluoropolymer surface of the free standing film.

Figure 5:
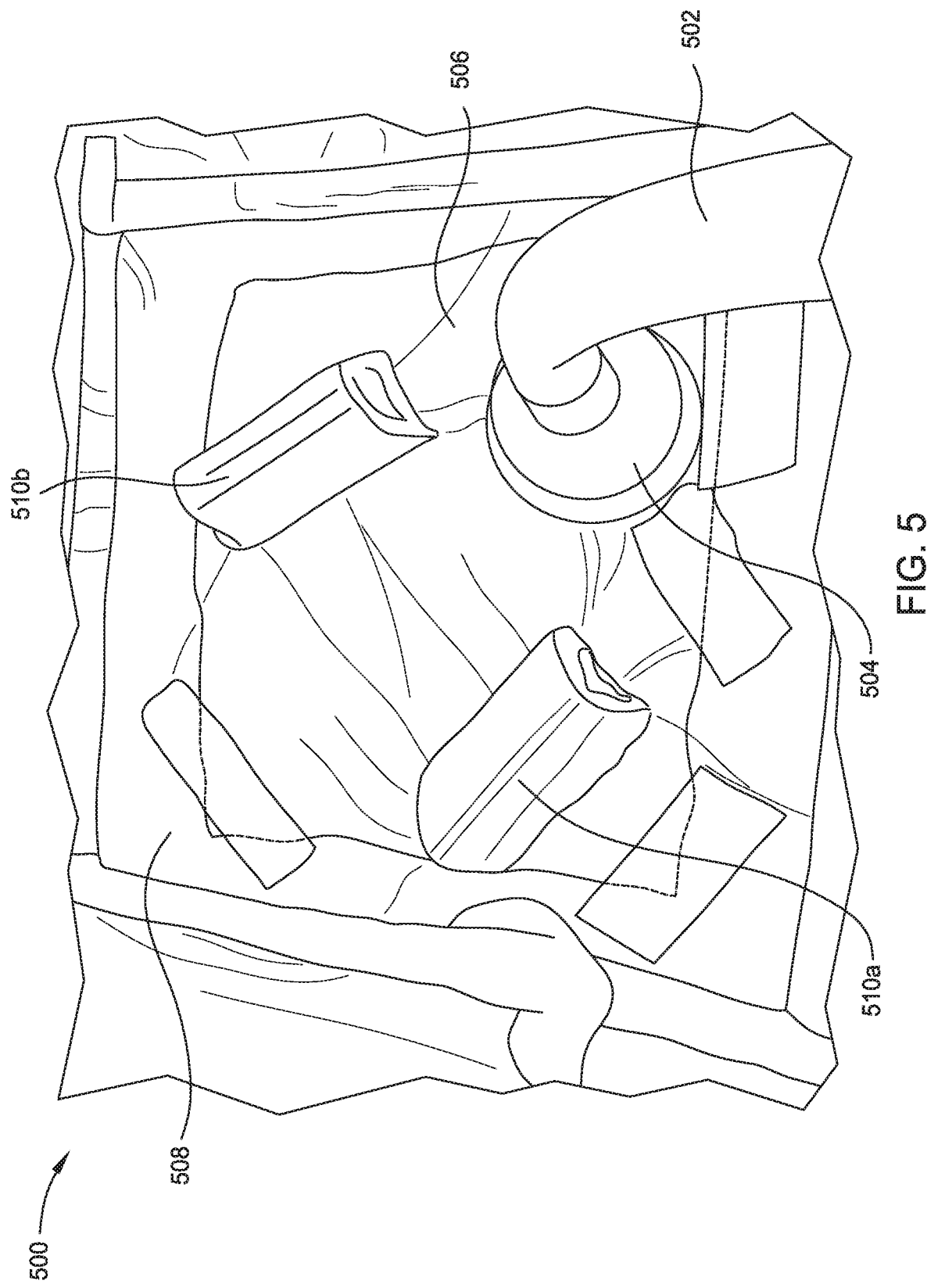
FIG. 5 is a perspective view of a vacuum bag apparatus, according to one example.

The entire (pressed) assembly is then sealed in a vacuum bag. FIG. 5 is a perspective view of a vacuum bag apparatus 500. As shown in FIG. 5, vacuum hose 502 is connected to vacuum seal 504. Vacuum seal 504 is connected to vacuum bag 506. Vacuum bag 506 is disposed on metal plate 508 and two assemblies shown at locations 510a and 510b. Metal plate 508 provides improved vacuum efficiency. The metal plate can be a flat metal plate and can comprise aluminium or stainless steel. It has been discovered that without the metal plate coupled to the vacuum bag, the vacuum bag wraps freely around the assembly creating voids and/or creases in the bag which, depending on the location of the creases and/or pleats, can affect the coating texture on the assembly.

A vacuum is applied to bag 506 ensuring contact with the free standing film to the fluoropolymer coated metal of the assembly. A pressure inside bag 506 during a vacuum bagging process can be from about 1 psi to about 20 psi, such as from about 7 psi to about 10 psi. Once air is substantially or completely removed from the bond line between the free standing film and the fluoropolymer coated metal of the assembly, the bagged assembly is transferred to an oven to cure the the pressed assembly, bring the composition to a baseline temperature (such as 50° C. or greater), and proceed with curing the composition. After curing, excess film (if present) can be trimmed from the edges of the component. The vacuum bag can contain one or more breather materials, such as a porous cotton material, disposed within the vacuum bag. Breather material provides connection of the vacuum to the assembly surface.

After a vacuum bagging procedure, the assembly can have a fluoropolymer (or composition containing fluoropolymer) (layer) of the present disclosure, as described above. For example, the layer can have a thickness of from about 10 mils to about 50 mils and an average void density of less than 5 voids of size 0.5 mm or greater per cm$^2$, such as less than 1 void of size 0.5 mm or greater per cm$^2$, as determined by optical microscopy, which can provide a smooth, conformal surface of the composition. In at least one example, the composition can have a surface roughness of less than about 100 microinches, such as less than about 90 microinches, such as less than about 80 microinches, such as less than about 70 microinches, such as from about 5 microinches to about 100 microinches, such as from about 20 microinches to about 80 microinches, as determined by ASTM D7127-05 (Standard Test Method for Measurement of Surface Roughness of Abrasive Blast Cleaned Metal Surfaces Using a Portable Stylus Instrument).

Examples

Clause 1. A compound represented by Formula (I):

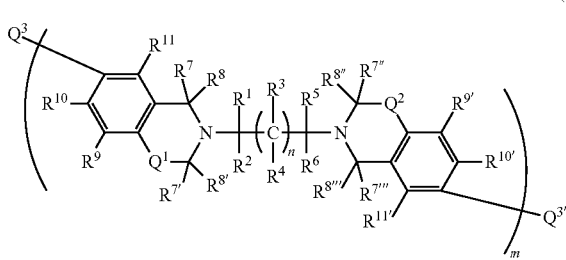

(I)

wherein:
each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;
each instance of $R^3$ and $R^4$ is independently hydrogen, unsubstituted $C_1$-$C_{10}$ alkyl, substituted $C_1$-$C_{10}$ alkyl, or fluorine, wherein at least one instance of $R^3$ or $R^4$ is fluorine;
each instance of $R^7$, $R^8$, $R^{7'}$, $R^{8'}$, $R^{7''}$, $R^{8''}$, $R^{7'''}$, and $R^{8'''}$ is independently hydrogen, unsubstituted $C_1$-$C_{10}$ alkyl, or substituted $C_1$-$C_{10}$ alkyl;
each instance of $R^9$, $R^{10}$, $R^{11}$, $R^{9'}$, $R^{10'}$, and $R^{1'}$ is independently hydrogen, unsubstituted $C_1$-$C_{10}$ alkyl, or substituted $C_1$-$C_{10}$ alkyl;
$R^{16}$ is hydrogen or hydroxyl;
each instance of $Q^1$ and $Q^2$ is independently oxygen or sulfur;
$Q^3$ and $Q^{3'}$ are independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

Clause 2. The compound of Clause 1, wherein each instance of $R^1$, $R^2$, $R^5$, and $R^6$ is hydrogen.

Clause 3. The compound of Clauses 1 or 2, wherein each instance of $R^3$ is fluorine.

Clause 4. The compound of any of Clauses 1-3, wherein each instance of $R^4$ is fluorine.

Clause 5. The compound of any of Clauses 1-4, wherein each instance of $Q^1$ and $Q^2$ is oxygen.

Clause 6. The compound of any of Clauses 1-5, wherein each instance of $R^7$, $R^8$, $R^{7'}$, $R^{8'}$, $R^{7''}$, $R^{8''}$, $R^{7'''}$, and $R^{8'}$ is hydrogen.

Clause 7. The compound of any of Clauses 1-6, wherein each instance of $R^9$, $R^{10}$, $R^{11}$, $R^{9'}$, $R^{10'}$, and $R^{11'}$ is hydrogen.

Clause 8. The compound of any of Clauses 1-7, wherein n is an integer from 3 to 10 and m is an integer from 3 to 6.

Clause 9. A composition comprising:
the compound of of any of Clauses 1-8; and
a metal oxide.

Clause 10. The composition of Clause 9, wherein the metal oxide is a nanoparticle having a particle diameter size of from about 1 nanometer to about 5 micrometers.

Clause 11. The composition of Clauses 9 or 10, wherein the metal oxide is selected from sodium oxide, magnesium oxide, calcium oxide, aluminum oxide, lithium oxide, silver oxide, iron (II) oxide, iron (III) oxide, chromium (VI) oxide, titanium (IV) oxide, copper (I) oxide, copper (II) oxide, zinc oxide, zirconium oxide, or a mixture thereof.

Clause 12. The composition of any of Clauses 9-11, wherein the metal oxide is selected from FeO, $Fe_2O_3$, $Fe_3O_4$ or a mixture thereof.

Clause 13. The composition of any of Clauses 9-12, wherein the composition comprises the metal oxide in an amount of from about 0.001 wt % to about 40 wt %, based on the total weight of the composition.

Clause 14. A compound represented by Formula (II):

(II)

wherein:

each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;

each instance of $R^3$ and $R^4$ is independently hydrogen, unsubstituted $C_1$-$C_{10}$ alkyl, substituted $C_1$-$C_{10}$ alkyl, or fluorine, wherein at least one instance of $R^3$ or $R^4$ is fluorine;

each instance of $R^7$, $R^8$, $R^{7'}$, $R^{8'}$, $R^{7''}$, $R^{8''}$, $R^{7'''}$, and $R^{8'''}$ is independently hydrogen, unsubstituted $C_1$-$C_{10}$ alkyl, or substituted $C_1$-$C_{10}$ alkyl;

each instance of $R^{10}$, $R^{11}$, $R^{10'}$, and $R^{1'}$ is independently hydrogen, unsubstituted $C_1$-$C_{10}$ alkyl, or substituted $C_1$-$C_{10}$ alkyl;

each instance of $Q^1$ and $Q^2$ is independently oxygen or sulfur;

$Q^3$ and $Q^{3'}$ are independently hydrogen, amino, imido, unsubstituted $C_1$-$C_{10}$ alkyl, or substituted $C_1$-$C_{10}$ alkyl;

each instance of n is an integer from 1 to 20; and m is an integer from 1 to 15.

Clause 15. The compound of Clause 14, wherein each instance of $R^1$, $R^2$, $R^5$, and $R^6$ is hydrogen.

Clause 16. The compound of Clauses 14 or 15, wherein each instance of $R^3$ is fluorine.

Clause 17. The compound of any of Clauses 14-16, wherein each instance of $R^4$ is fluorine.

Clause 18. The compound of any of Clauses 14-17, wherein each instance of $Q^1$ and $Q^2$ is oxygen.

Clause 19. The compound of any of Clauses 14-18, wherein each instance of $R^7$, $R^8$, $R^{7'}$, $R^{8'}$, $R^{7''}$, $R^{8''}$, $R^{7'''}$, and $R^{8'''}$ is hydrogen.

Clause 20. The compound of any of Clauses 14-19, wherein each instance of $R^{10}$, $R^{11}$, $R^{10'}$, and $R^{11'}$, is hydrogen.

Clause 21. The compound of any of Clauses 14-20, wherein n is an integer from 3 to 10 and m is an integer from 3 to 6.

Clause 22. A composition comprising:
the compound of any of Clauses 14-21; and
a metal oxide.

Clause 23. The composition of Clause 22, wherein the metal oxide is a nanoparticle having a particle diameter size of from about 1 nanometer to about 5 micrometers.

Clause 24. The composition of Clauses 22 or 23, wherein the metal oxide is selected from sodium oxide, magnesium oxide, calcium oxide, aluminum oxide, lithium oxide, silver oxide, iron (II) oxide, iron (III) oxide, chromium (VI) oxide, titanium (IV) oxide, copper (I) oxide, copper (II) oxide, zinc oxide, zirconium oxide, or a mixture thereof.

Clause 25. The composition of any of Clauses 22-24, wherein the metal oxide is selected from $FeO$, $Fe_2O_3$, $Fe_3O_4$ or a mixture thereof.

Clause 26. The composition of any of Clauses 22-25, wherein the composition comprises the metal oxide in an amount of from about 0.001 wt % to about 40 wt %, based on the total weight of the composition.

Clause 27. A compound represented by Formula (III):

(III)

wherein:

Z is fluorinated aryl group;

each instance of $R^1$, $R^2$, $R^{1'}$, $R^{2'}$, $R^{1''}$, $R^{2''}$, $R^{1'''}$, and $R^{2'''}$ is independently hydrogen, unsubstituted $C_1$-$C_{10}$ alkyl, or substituted $C_1$-$C_{10}$ alkyl;

each instance of $R^3$, $R^4$, $R^5$, $R^6$, $R^7$, $R^8$, and $R^9$ is independently hydrogen, unsubstituted $C_1$-$C_{10}$ alkyl, or substituted $C_1$-$C_{10}$ alkyl;

each instance of $Q^1$ and $Q^2$ is independently oxygen or sulfur;

$Q^3$ and $Q^{3'}$ are independently hydrogen, amino, imido, unsubstituted $C_1$-$C_{10}$ alkyl, or substituted $C_1$-$C_{10}$ alkyl;

each instance of n is an integer from 1 to 20; and m is an integer from 1 to 15.

Clause 28. The compound of Clause 27, wherein each instance of $Q^1$ and $Q^2$ is oxygen.

Clause 29. The compound of Clauses 27 or 28, wherein each instance of $R^1$, $R^2$, $R^{1'}$, $R^{2'}$, $R^{1''}$, $R^{2''}$, $R^{1'''}$, and $R^{2'''}$ is hydrogen.

Clause 30. The compound of any of Clauses 27-29, wherein each instance of $R^3$, $R^4$, $R^5$, $R^{3'}$, $R^{4'}$, and $R^{5'}$ is hydrogen.

Clause 31. The compound of any of Clauses 27-30, wherein Z is a phenyl group having 1, 2, 3, or 4 fluoro substituents or Z is a naphthyl group having 1, 2, 3, 4, 5, or 6 fluoro substituents.

Clause 32. The compound of any of Clauses 27-31, wherein Z is a fluorinated aryl group represented by the formula:

wherein each of $R^6$, $R^7$, $R^8$, and $R^9$ are independently selected from hydrogen, unsubstituted $C_1$-$C_{10}$ alkyl, substituted $C_1$-$C_{10}$ alkyl, or fluorine, wherein at least one instance of $R^6$, $R^7$, $R^8$, or $R^9$ is fluorine.

Clause 33. The compound of any of Clauses 27-32, wherein each of $R^6$, $R^7$, $R^8$, and $R^9$ is fluorine.

Clause 34. A composition comprising:
the compound of any of Clauses 27-33; and
a metal oxide.

Clause 35. The composition of Clause 34, wherein the metal oxide is a nanoparticle having a particle diameter size of from about 1 nanometer to about 5 micrometers.

Clause 36. The composition of Clauses 34 or 35, wherein the metal oxide is selected from sodium oxide, magnesium oxide, calcium oxide, aluminum oxide, lithium oxide, silver oxide, iron (II) oxide, iron (III) oxide, chromium (VI) oxide, titanium (IV) oxide, copper (I) oxide, copper (II) oxide, zinc oxide, zirconium oxide, or a mixture thereof.

Clause 37. The composition of any of Clauses 34-36, wherein the metal oxide is selected from $FeO$, $Fe_2O_3$, $Fe_3O_4$ or a mixture thereof.

Clause 38. The composition of any of Clauses 34-37, wherein the composition comprises the metal oxide in an amount of from about 0.001 wt % to about 40 wt %, based on the total weight of the composition.

Clause 39. A compound represented by Formula (IV):

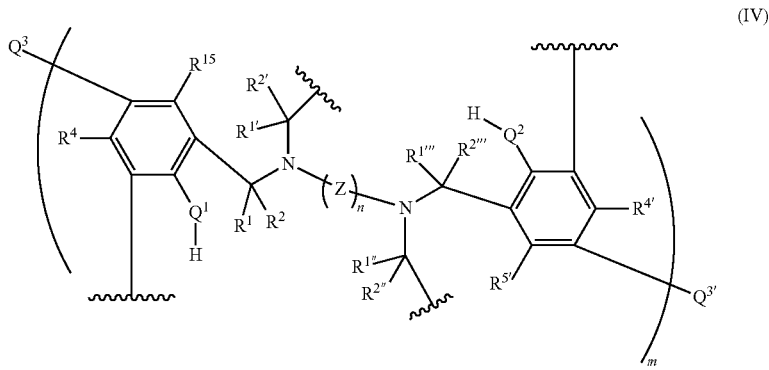

wherein:
Z is fluorinated aryl group;
each instance of $R^1$, $R^2$, $R^{1'}$, $R^{2'}$, $R^{1''}$, $R^{2''}$, $R^{1'''}$, and $R^{2''''}$ is independently hydrogen, unsubstituted $C_1$-$C_{10}$ alkyl, or substituted $C_1$-$C_{10}$ alkyl;
each instance of $R^4$, $R^5$, $R^{4'}$, or $R^{5'}$ is independently hydrogen, unsubstituted $C_1$-$C_{10}$ alkyl, or substituted $C_1$-$C_{10}$ alkyl;
each instance of $Q^1$ and $Q^2$ is independently oxygen or sulfur;
$Q^3$ and $Q^{3'}$ are independently hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

Clause 40. The compound of Clause 39, wherein each instance of $Q^1$ and $Q^2$ is oxygen.

Clause 41. The compound of Clauses 39 or 40, wherein each instance of $R^1$, $R^2$, $R^{1'}$, $R^{2'}$, $R^{1''}$, $R^{2''}$, $R^{1'''}$, and $R^{2''''}$ is hydrogen.

Clause 42. The compound of any of Clauses 39-41, wherein each instance of $R^4$, $R^5$, $R^{4'}$, and $R^{5'}$ is hydrogen.

Clause 43. The compound of any of Clauses 39-42, wherein Z is a phenyl group having 1, 2, 3, or 4 fluoro substituents or Z is a naphthyl group having 1, 2, 3, 4, 5, or 6 fluoro substituents.

Clause 44. The compound of any of Clauses 39-42, wherein Z is a fluorinated aryl group represented by the formula:

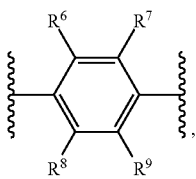

wherein each of $R^6$, $R^7$, $R^8$, and $R^9$ are independently selected from hydrogen, unsubstituted $C_1$-$C_{10}$ alkyl, substituted $C_1$-$C_{10}$ alkyl, or fluorine, wherein at least one instance of $R^6$, $R^7$, $R^8$, or $R^9$ is fluorine.

Clause 45. The compound of any of Clauses 39-44, wherein each of $R^6$, $R^7$, $R^8$, and $R^9$ is fluorine.

Clause 46. A composition comprising:
the compound of any of Clauses 39-45; and
a metal oxide.

Clause 47. The composition of Clause 46, wherein the metal oxide is a nanoparticle having a particle diameter size of from about 1 nanometer to about 5 micrometers.

Clause 48. The composition of Clauses 46 or 47, wherein the metal oxide is selected from sodium oxide, magnesium oxide, calcium oxide, aluminum oxide, lithium oxide, silver oxide, iron (II) oxide, iron (III) oxide, chromium (VI) oxide, titanium (IV) oxide, copper (I) oxide, copper (II) oxide, zinc oxide, zirconium oxide, or a mixture thereof.

Clause 49. The composition of any of Clauses 46-48, wherein the metal oxide is selected from FeO, $Fe_2O_3$, $Fe_3O_4$ or a mixture thereof.

Clause 50. The composition of any of Clauses 46-49, wherein the composition comprises the metal oxide in an amount of from about 0.001 wt % to about 40 wt %, based on the total weight of the composition.

Clause 51. A compound represented by Formula (V):

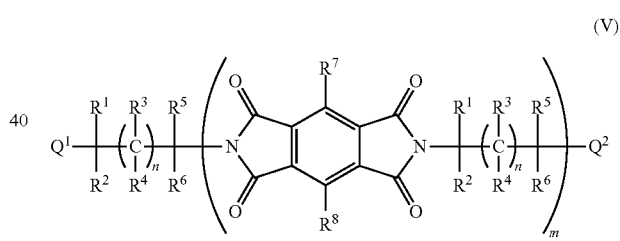

wherein:
each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;
each instance of $R^3$ and $R^4$ is independently hydrogen, amino, unsubstituted $C_1$-$C_{10}$ alkyl, substituted $C_1$-$C_{10}$ alkyl, or fluorine, wherein at least one instance of $R^3$ or $R^4$ is fluorine;
each instance of $R^7$ and $R^8$ is independently independently hydrogen, unsubstituted $C_1$-$C_{10}$ aryl, substituted $C_1$-$C_{10}$ aryl, unsubstituted $C_1$-$C_{10}$ alkyl, or substituted $C_1$-$C_{10}$ alkyl;
each instance of $Q^1$ and $Q^2$ is hydrogen, amino, imido, unsubstituted $C_1$-$C_{10}$ alkyl, or substituted $C_1$-$C_{10}$ alkyl;
each instance of n is an integer from 1 to 20; and
m is an integer from 1 to 15.

Clause 52. The compound of Clause 51, wherein each instance of $R^1$, $R^2$, $R^5$, and $R^6$ is hydrogen.

Clause 53. The compound of Clauses 51 or 52, wherein each instance of $R^3$ is fluorine.

Clause 54. The compound of any of Clauses 51-53, wherein each instance of $R^4$ is fluorine.

Clause 55. The compound of any of Clauses 51-54, wherein at least one instance of $R^3$ or $R^4$ is amino.
Clause 56. The compound of any of Clauses 51-55, wherein each instance of $Q^1$ and $Q^2$ is independently hydrogen or amino.
Clause 57. A composition comprising:
the compound of any of Clauses 51-56; and
a metal oxide.
Clause 58. The composition of Clause 57, wherein the metal oxide is a nanoparticle having a particle diameter size of from about 1 nanometer to about 5 micrometers.
Clause 59. The composition of Clauses 57 or 58, wherein the metal oxide is selected from sodium oxide, magnesium oxide, calcium oxide, aluminum oxide, lithium oxide, silver oxide, iron (II) oxide, iron (III) oxide, chromium (VI) oxide, titanium (IV) oxide, copper (I) oxide, copper (II) oxide, zinc oxide, zirconium oxide, or a mixture thereof.
Clause 60. The composition of any of Clauses 57-59, wherein the metal oxide is selected from FeO, $Fe_2O_3$, $Fe_3O_4$ or a mixture thereof.
Clause 61. The composition of any of Clauses 57-60, wherein the composition comprises the metal oxide in an amount of from about 0.001 wt % to about 40 wt %, based on the total weight of the composition.
Clause 62. A compound represented by Formula (VI):

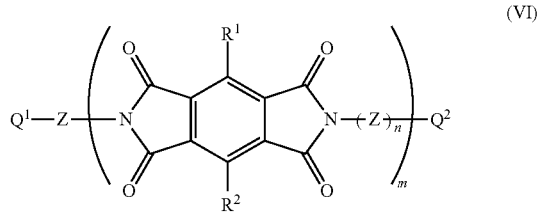

(VI)

wherein:
Z is fluorinated aryl group;
each instance of $Q^1$ and $Q^2$ is hydrogen, amino, imido, unsubstituted $C_1$-$C_{10}$ alkyl, or substituted $C_1$-$C_{10}$ alkyl;
each instance of $R^1$ and $R^2$ is independently independently hydrogen, unsubstituted $C_1$-$C_{10}$ alkyl, or substituted $C_1$-$C_{10}$ alkyl;
each instance of n is an integer from 1 to 20; and
m is an integer from 1 to 15.
Clause 63. The compound of Clause 62, wherein each instance of $Q^1$ and $Q^2$ is independently hydrogen or amino.
Clause 64. The compound of Clauses 62 or 63, wherein each instance of $R^1$ and $R^2$ is hydrogen.
Clause 65. The compound of any of Clauses 62-64, wherein Z is a phenyl group having 1, 2, 3, or 4 fluoro substituents or Z is a naphthyl group having 1, 2, 3, 4, 5, or 6 fluoro substituents.
Clause 66. The compound of any of Clauses 62-65, wherein Z is a fluorinated aryl group represented by the formula:

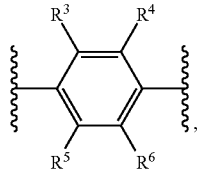

, wherein each of $R^3$, $R^4$, $R^5$, and $R^5$ is independently selected from hydrogen, amino, unsubstituted $C_1$-$C_{10}$ alkyl, substituted $C_1$-$C_{10}$ alkyl, or fluorine, wherein at least one instance of $R^3$, $R^4$, $R^5$, and $R^5$ is fluorine.
Clause 67. The compound of any of Clauses 62-66, wherein each of $R^3$, $R^4$, $R^5$, and $R^5$ is fluorine.
Clause 68. A composition comprising:
the compound of any of Clauses 62-67; and
a metal oxide.
Clause 69. The composition of Clause 68, wherein the metal oxide is a nanoparticle having a particle diameter size of from about 1 nanometer to about 5 micrometers.
Clause 70. The composition of Clauses 68 or 69, wherein the metal oxide is selected from sodium oxide, magnesium oxide, calcium oxide, aluminum oxide, lithium oxide, silver oxide, iron (II) oxide, iron (III) oxide, chromium (VI) oxide, titanium (IV) oxide, copper (I) oxide, copper (II) oxide, zinc oxide, zirconium oxide, or a mixture thereof.
Clause 71. The composition of any of Clauses 68-71, wherein the metal oxide is selected from FeO, $Fe_2O_3$, $Fe_3O_4$ or a mixture thereof.
Clause 72. The composition of any of Clauses 68-72, wherein the composition comprises the metal oxide in an amount of from about 0.001 wt % to about 40 wt %, based on the total weight of the composition.
Clause 73. A method for forming a polyfluorobenzoxazine, comprising:
introducing a fluorinated diamine to a bisphenol, a formaldehyde, and a solvent to form a mixture, wherein a molar ratio of diamine:bisphenol is from about 1:1 to about 2:1;
refluxing the mixture; and
obtaining the polyfluorobenzoxazine.
Clause 74. The method of Clause 73, wherein the diamine is represented by Formula (V):

(VII)

wherein:
each instance of $R^1$, $R^2$, $R^5$, and $R^6$ is independently hydrogen, unsubstituted $C_1$-$C_{10}$ alkyl, substituted $C_1$-$C_{10}$ alkyl, unsubstituted $C_1$-$C_{10}$ alkoxy, or substituted $C_1$-$C_{10}$ alkoxy;
each instance of $R^3$ and $R^4$ is independently hydrogen, unsubstituted $C_1$-$C_{10}$ alkyl, substituted $C_1$-$C_{10}$ alkyl, or fluorine, wherein at least one instance of $R^3$ or $R^4$ is fluorine;
Q is hydrogen, amino, imido, unsubstituted $C_1$-$C_{10}$ alkyl, or substituted $C_1$-$C_{10}$ alkyl; and
n is an integer from 1 to 20.
Clause 75. The method of Clauses 73 or 74, wherein each instance of $R^3$ and $R^4$ is fluorine.
Clause 76. The method of any of Clauses 73-75, wherein $R^1$, $R^2$, $R^5$, and $R^6$ are hydrogen.
Clause 77. A method for forming a crosslinked polyfluorobenzoxazine, comprising:
applying a composition to a surface of a component, the composition comprising:
a polyfluorobenzoxazine, and
a solvent;
curing the composition at a first temperature of about 100° C. or greater;
increasing the first temperature to a second temperature of about 160° C. or greater; and obtaining a coating disposed on the surface of the component, the coating comprising the crosslinked polyfluorobenzoxazine.

Clause 78. A method of forming a polyphthalonitrile, comprising:

introducing a solvent having a boiling point of 140° C. or greater, a solvent having a boiling point less than 140° C., a catalyst, and one or both of a polyfluorobenzoxazine and a fluorodiamine to form a mixture;

refluxing the mixture;

removing the low boiling point solvent to form a second mixture;

introducing a phthalonitrile to the second mixture to form a third mixture, wherein a molar ratio of phthalonitrile to polyfluorobenzoxazine or fluorodiamine can be from about 1:1 to about 3:1; and precipitating the polyphthalonitrile from the third mixture.

Clause 79. The method of Clause 78, wherein the catalyst is a weak base, an acid, or a copper catalyst.

Clause 80. The method of Clause 79, wherein the catalyst is selected from potassium carbonate, para-toluenesulfonic acid, bromotris(triphenylphosphine)copper(I), copper (II) acetylacetonate, or a mixture thereof.

Clause 81. The method of Clause 78, wherein the polyphthalonitrile is a polyphthalocyanine, a polyisoindoline, or a polytriazine, or a combination thereof.

Clause 82. A method for forming a crosslinked polyphthalonitrile, comprising:

applying a composition to a surface of a component, the composition comprising:

a polyphthalonitrile, and a solvent;

curing the composition at a first temperature of about 100° C. or greater;

increasing the first temperature to a second temperature of about 160° C. or greater; and obtaining a coating disposed on the surface of the component, the coating comprising the crosslinked polyphthalonitrile.

Overall, polymers of the present disclosure may be used as an adhesive. Fluoropolymers of the present disclosure can provide adhesives suitable for use in high temperature environments. High use temperature provides for use of the polymers on components of a vehicle/aircraft. Another application of polymers of the present disclosure may be as an adhesive as a diffusion bonded film with a lower processing temperature than typical thermoplastic and thermoset composites. This allows for joining of composite parts with the use of fewer or no fasteners. The present disclosure further provides compositions containing one or more fluoropolymers and one or more metal oxides nanoparticles. Metal oxide nanoparticles can provide improved radical scavenging ability, as compared to larger radical scavenging particles.

While the foregoing is directed to examples of the present disclosure, other and further examples of the present disclosure may be devised without departing from the basic scope thereof. Furthermore, while the foregoing is directed to polymers as applied to the aerospace industry, examples of the present disclosure may be directed to other applications not associated with an aircraft, such as applications in the automotive industry, marine industry, energy industry, wind turbines, satellites, and the like.

Definitions

As used herein, the term "substituted" means that a hydrogen atom has been replaced with one or more non-hydrogen substitutents. For example, a substituent can be fluoro, aryl, substituted aryl (such as fluoro aryl, perfluoro aryl), heterocyclyl (such as heteroaryl) (such as fluoro heterocyclyl, perfluoro heterocyclyl), hydroxyl, amino, halogen, or a combination thereof.

The term "alkyl" includes a substituted or unsubstituted, linear or branched acyclic alkyl radical containing from 1 to about 20 carbon atoms. In at least one example, alkyl is a $C_{1-10}$alkyl, $C_{1-7}$alkyl or $C_{1-5}$alkyl. Examples of alkyl include, but are not limited to, methyl, ethyl, propyl, butyl, pentyl, hexyl, heptyl, octyl, nonyl, decyl, and structural isomers thereof.

The term "cycloalkyl" includes a substituted or unsubstituted, cyclic alkyl radical containing from 3 to about 20 carbon atoms.

The term "hydroxy" and "hydroxyl" each refers to —OH.

The term "imide" or "imido" refers to a moiety represented by the structure:

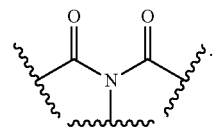 [SMILES: *C(=O)N(*)C(*)=O]

For example, an imide can be represented by the structure:

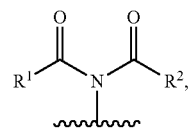

where $R^1$ and $R^2$ are substituted alkyl, unsubstituted alkyl, or $R^1$ and $R^2$ are joined to form a C4-C20 cyclic, polycyclic, or aromatic group. For example, $R^1$ and $R^2$ are joined such that the imide is a maleimide.

The term "amine" or "amino" refers to a primary, secondary or tertiary amine-containing radical. An example of an amino radical is —NH$_2$. An amino radical may be substituted with $R^4$ or $R^5$ (e.g.,

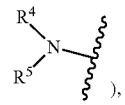

where $R^4$ may be, for example, cyano, haloacyl, alkenylcarbonyl, hydroxyalkenylcarbonyl, aminoalkenylcarbonyl, monoalkylaminoalkenylcarbonyl, dialkylaminoalkenylcarbonyl, haloalkenylcarbonyl, cyanoalkenylcarbonyl, alkoxycarbonylalkenylcarbonyl, alkynylcarbonyl, hydroxyalkynylcarbonyl, alkylcarbonylalkenylcarbonyl, cycloalkylcarbonylalkenylcarbonyl, arylcarbonylalkenylcarbonyl, aminocarbonylalkenylcarbonyl, monoalkylaminocarbonylalkenylcarbonyl, dialkylaminocarbonylalkenylcarbonyl or alkenylsulfonyl; and $R^5$ may be, for example, H, alkyl or cycloalkyl.

Compounds of the present disclosure include tautomeric, geometric or stereoisomeric forms of the compounds. Ester, oxime, onium, hydrate, solvate and N-oxide forms of a compound are also embraced by the present disclosure. The present disclosure considers all such compounds, including cis- and trans-geometric isomers (Z- and E-geometric isomers), R- and S-enantiomers, diastereomers, d-isomers, l-isomers, atropisomers, epimers, conformers, rotamers, mixtures of isomers and racemates thereof are embraced by the present disclosure.

The descriptions of the various examples of the present disclosure have been presented for purposes of illustration, but are not intended to be exhaustive or limited to the examples disclosed. Many modifications and variations will be apparent to those of ordinary skill in the art without departing from the scope and spirit of the described examples. The terminology used herein was chosen to best explain the principles of the examples, the practical application or technical improvement over technologies found in the marketplace, or to enable others of ordinary skill in the art to understand the examples disclosed herein. While the foregoing is directed to examples of the present disclosure, other and further examples of the present disclosure may be devised without departing from the basic scope thereof.

What is claimed is:

1. A composition comprising:
   a metal oxide selected from FeO, $Fe_2O_3$, $Fe_3O_4$ or a mixture thereof; and
   a compound represented by Formula (I):

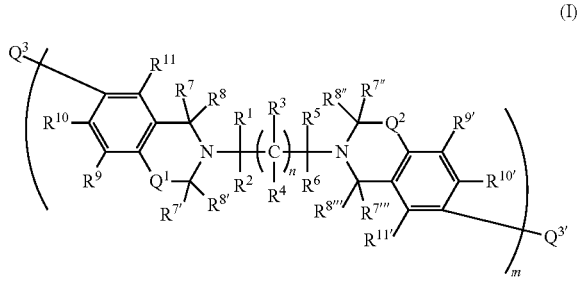

wherein:
   each instance of $R^1$, $R^2$, $R^5$, and $R^6$ is independently hydrogen, unsubstituted alkyl, substituted $C_1$-$C_{10}$ alkyl, unsubstituted alkoxy, or substituted $C_1$-$C_{10}$ alkoxy;
   each instance of $R^3$ and $R^4$ is independently hydrogen, unsubstituted $C_1$-$C_{10}$ alkyl, substituted $C_1$-$C_{10}$ alkyl, or fluorine, wherein at least one instance of $R^3$ or $R^4$ is fluorine;
   each instance of $R^7$, $R^8$, $R^{7'}$, $R^{8'}$, $R^{7''}$, $R^{8''}$, $R^{7'''}$, and $R^{8'''}$ is independently hydrogen, unsubstituted $C_1$-$C_{10}$ alkyl, or substituted $C_1$-$C_{10}$ alkyl;
   each instance of $R^9$, $R^{10}$, $R^{11}$, $R^{9'}$, $R^{10'}$ and $R^{11'}$ is independently hydrogen, unsubstituted $C_1$-$C_{10}$ alkyl, or substituted $C_1$-$C_{10}$ alkyl;
   each instance of $Q^1$ and $Q^2$ is independently oxygen or sulfur;
   $Q^3$ and $Q^{3'}$ are independently hydrogen, amino, imido, unsubstituted $C_1$-$C_{10}$ alkyl, or substituted $C_1$-$C_{10}$ alkyl;
   each instance of n is an integer from 1 to 20; and
   m is an integer from 1 to 15.

2. The composition of claim 1, wherein each instance of $R^1$, $R^2$, $R^5$, and $R^6$ is hydrogen.

3. The composition of claim 2, wherein each instance of $R^3$ is fluorine.

4. The composition of claim 3, wherein each instance of $R^4$ is fluorine.

5. The composition of claim 4, wherein each instance of $Q^1$ and $Q^2$ is oxygen.

6. The composition of claim 5, wherein each instance of $R^7$, $R^8$, $R^{7'}$, $R^{8'}$, $R^{7''}$, $R^{8''}$, $R^{7'''}$, and $R^{8'''}$ is hydrogen.

7. The composition of claim 6, wherein each instance of $R^9$, $R^{10}$, $R^{11}$, $R^{9'}$, $R^{10'}$, and $R^{11'}$ is hydrogen.

8. The composition of claim 7, wherein n is an integer from 3 to 10 and m is an integer from 3 to 6.

9. The composition of claim 1, wherein the metal oxide is a nanoparticle having a particle diameter size of from about 1 nanometer to about 5 micrometers.

10. The composition of claim 1, wherein the composition further comprises a second metal oxide selected from sodium oxide, magnesium oxide, calcium oxide, aluminum oxide, lithium oxide, silver oxide, chromium (VI) oxide, titanium (IV) oxide, copper (I) oxide, copper (II) oxide, zinc oxide, zirconium oxide, or a mixture thereof.

11. The composition of claim 1, wherein the composition comprises the metal oxide in an amount of from about 0.001 wt % to about 40 wt %, based on the total weight of the composition.

12. The composition of claim 1, wherein the composition further comprises a second metal oxide selected from sodium oxide, magnesium oxide, calcium oxide, aluminum oxide, lithium oxide, silver oxide, chromium (VI) oxide, titanium (IV) oxide, zinc oxide, zirconium oxide, or a mixture thereof.

13. The composition of claim 1, wherein m is 1.

14. The composition of claim 1, wherein m is 3 to 6.

15. The composition of claim 1, wherein each instance of $R^3$ is fluorine.

16. The composition of claim 1, wherein each instance of $R^4$ is fluorine.

17. The composition of claim 1, wherein each instance of $Q^1$ is oxygen.

18. The composition of claim 17, wherein each instance of $Q^2$ is oxygen.

19. The composition of claim 1, wherein each instance of $Q^1$ is sulfur.

20. The composition of claim 19, wherein each instance of $Q^2$ is sulfur.

21. The composition of claim 1, wherein each instance of $R^7$, $R^8$, $R^{7'}$, $R^{8'}$, $R^{7''}$, $R^{8''}$, $R^{7'''}$ and $R^{8'''}$ is hydrogen.

22. The composition of claim 1, wherein each instance of $R^9$, $R^{10}$, $R^{11}$, $R^{9'}$, $R^{10'}$, and $R^{11'}$ is hydrogen.

23. The composition of claim 1, wherein each instance of $R^9$, $R^{10}$, $R^{11}$, $R^{9'}$, $R^{10'}$, and $R^{11'}$ is independently unsubstituted $C_1$-$C_{10}$ alkyl.

24. The composition of claim 1, wherein each instance of $R^1$, $R^2$, $R^5$, and $R^6$ is independently unsubstituted $C_1$-$C_{10}$ alkyl.

25. The composition of claim 1, wherein each instance of $R^3$ and $R^4$ is independently unsubstituted $C_1$-$C_{10}$ alkyl or fluorine, wherein at least one instance of $R^3$ or $R^4$ is fluorine.

26. The composition of claim 1, wherein each instance of $R^7$, $R^8$, $R^{7'}$, $R^{8'}$, $R^{7''}$, $R^{8''}$, $R^{7'''}$ and $R^{8'''}$ is independently unsubstituted $C_1$-$C_{10}$ alkyl.

27. The composition of claim 1, wherein $Q^3$ and $Q^{3'}$ are independently unsubstituted $C_1$-$C_{10}$ alkyl.

28. The composition of claim 1, wherein n is 1.

29. The composition of claim 1, wherein n is 3 to 6.

30. The composition of claim 1, wherein the metal oxide is FeO.

31. The composition of claim 1, wherein the metal oxide is $Fe_2O_3$.

32. The composition of claim 1, wherein the metal oxide is $Fe_3O_4$.

33. The composition of claim 1, wherein the metal oxide is a nanoparticle having a particle diameter size of from about 25 nanometers to about 2 micrometers.

34. The composition of claim 1, wherein the metal oxide is a nanoparticle having a particle diameter size of from about 50 nanometers to about 500 nanometers.

35. The composition of claim 1, wherein the composition comprises the metal oxide in an amount of from about 0.1 wt % to about 10 wt %, based on the total weight of the composition.

36. The composition of claim 35, wherein the composition comprises the metal oxide in an amount of from about 1 wt % to about 5 wt %, based on the total weight of the composition.

37. The composition of claim 35, wherein the composition comprises the metal oxide in an amount of from about 5 wt % to about 10 wt %, based on the total weight of the composition.

38. The composition of claim 1, wherein the composition comprises the compound represented by Formula (I) in an amount of from about 60 wt % to about 95 wt %.

39. The composition of claim 38, wherein the composition comprises the compound represented by Formula (I) in an amount of from about 85 wt % to about 90 wt %.

\* \* \* \* \*

UNITED STATES PATENT AND TRADEMARK OFFICE
CERTIFICATE OF CORRECTION

PATENT NO. : 11,421,080 B2
APPLICATION NO. : 16/226953
DATED : August 23, 2022
INVENTOR(S) : Ashley M. Dustin et al.

It is certified that error appears in the above-identified patent and that said Letters Patent is hereby corrected as shown below:

In the Claims

In Column 39, Line 23, in Claim 1, delete "$Fe_3O_4$" and insert -- $Fe_3O_4$, --.

In Column 39, Line 42, in Claim 1, after "unsubsituted" insert -- $C_1$-$C_{10}$ --.

In Column 39, Line 43, in Claim 1, after "unsubsituted" insert -- $C_1$-$C_{10}$ --.

In Column 39, Line 51, in Claim 1, delete "$R^{10}$" and insert -- $R^{10'}$, --.

In Column 40, Line 43, in Claim 21, delete "$R^{7''}$" and insert -- $R^{7'''}$, --.

In Column 40, Line 56, in Claim 26, delete "$R^{7''}$" and insert -- $R^{7'''}$, --.

Signed and Sealed this
Twenty-fourth Day of January, 2023

Katherine Kelly Vidal
*Director of the United States Patent and Trademark Office*